US012628294B2

(12) United States Patent
Lee et al.

(10) Patent No.: US 12,628,294 B2
(45) Date of Patent: May 12, 2026

(54) DISPLAY DEVICE

(71) Applicant: LG Display Co., Ltd., Seoul (KR)

(72) Inventors: Hyosung Lee, Gwangmyeong-si (KR); Seunghee Lee, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 106 days.

(21) Appl. No.: 18/888,526

(22) Filed: Sep. 18, 2024

(65) Prior Publication Data

US 2025/0098083 A1      Mar. 20, 2025

(30) Foreign Application Priority Data

Sep. 19, 2023    (KR) ........................ 10-2023-0124675

(51) Int. Cl.
H05K 5/02          (2006.01)
(52) U.S. Cl.
CPC .................................. H05K 5/0217 (2013.01)
(58) Field of Classification Search
None
See application file for complete search history.

(56) References Cited

U.S. PATENT DOCUMENTS

| | | | |
|---|---|---|---|
| 10,743,429 B2 * | 8/2020 | Choi | ................ G02F 1/133305 |
| 12,461,564 B2 * | 11/2025 | Ahn | ...................... G06F 1/1624 |

| | | | |
|---|---|---|---|
| 2017/0344073 A1 * | 11/2017 | Kang | .................. H04M 1/0268 |
| 2021/0029840 A1 * | 1/2021 | Kwon | ................... G06F 1/1652 |
| 2022/0078934 A1 * | 3/2022 | Lee | ...................... H10K 59/871 |
| 2023/0217609 A1 * | 7/2023 | Lee | .......................... G09F 9/301 |
| | | | 361/807 |
| 2024/0049411 A1 * | 2/2024 | Jang | ...................... B60K 35/81 |

FOREIGN PATENT DOCUMENTS

| | | |
|---|---|---|
| KR | 10-2001-0064486 A | 7/2001 |
| KR | 10-2022-0150318 A | 11/2022 |
| KR | 10-2024-0108033 A | 7/2024 |

* cited by examiner

*Primary Examiner* — James Wu
*Assistant Examiner* — Christopher L Augustin
(74) *Attorney, Agent, or Firm* — Birch, Stewart, Kolasch & Birch, LLP

(57) ABSTRACT

A display device can include a display part having a display panel configured to display an image, a first roller configured to wind or unwind the display part, a tape spring disposed on a rear surface of the display part, configured to move the display part in an upward/downward direction, and including a plurality of guide holes, and a second roller configured to wind or unwind the tape spring. The second roller includes a tape spring drum to which one end of the tape spring is fixed. The tape spring drum is configured to wind or unwind the tape spring and includes a plurality of guide protrusions. The second roller further includes a plurality of rotary pins spaced apart from the tape spring drum and disposed along an outer peripheral surface of the tape spring drum.

17 Claims, 21 Drawing Sheets

DP

120

AA

NA

130

140

COLUMN
DIRECTION

ROW
DIRECTION

DP 120
110
130
140

COLUMN
DIRECTION

ROW
DIRECTION

DISPLAY DEVICE

CROSS-REFERENCE TO RELATED APPLICATIONS

This application claims priority to Korean Patent Application No. 10-2023-0124675 filed on Sep. 19, 2023, in the Korean Intellectual Property Office, the entire contents of which is hereby expressly incorporated by reference into the present application.

BACKGROUND

Field

The present disclosure relates to a display device, and more particularly, to a rollable display device capable of displaying images even in case that the display device is rolled up.

Discussion of the Related Art

As display devices used for a monitor of a computer, a TV set, a mobile phone, and the like, there are an organic light-emitting display (OLED) configured to autonomously emit, and a liquid crystal display (LCD) that requires a separate light source.

The range of application of the display devices is diversified from the monitor of the computer and the TV set to personal mobile devices, and studies are being conducted on the display devices having wide display areas and having reduced volumes and weights.

In addition, recently, a rollable display device is provided, which is made by forming display parts, lines, and the like on a substrate made of a flexible plastic material having flexibility. Such rollable display device can display images even in case that the rollable display device is rolled up, and thus has attracted attention as a next-generation display device.

SUMMARY OF THE DISCLOSURE

An object to be achieved by aspects of the present disclosure is to provide a display device capable of suppressing the occurrence of a gap and slip in the tape spring.

Another object to be achieved by aspects of the present disclosure is to provide a display device capable of precisely controlling a movement amount of a display part.

Still another object to be achieved by aspects of the present disclosure is to provide a display device capable of reducing friction and weight of a tape spring by using a plurality of rotary pins.

Objects of the present disclosure are not limited to the above-mentioned objects, and other objects, which are not mentioned above, can be clearly understood by those skilled in the art from the following descriptions.

According to an aspect of the present disclosure, there is provided a display device. The display device comprises a display part including a display panel configured to display an image, a first roller configured to wind or unwind the display part, a tape spring disposed on a rear surface of the display part, configured to move the display part in an upward/downward direction, and including a plurality of guide holes, and a second roller configured to wind or unwind the tape spring. The second roller comprises a tape spring drum to which one end of the tape spring is fixed, the tape spring drum being configured to wind or unwind the tape spring and including a plurality of guide protrusions, and a plurality of rotary pins spaced apart from the tape spring drum and disposed along an outer peripheral surface of the tape spring drum.

According to aspects of the present disclosure, the tape spring drum can include the plurality of guide protrusions, and the tape spring can include the plurality of guide holes, which can suppress the occurrence of a gap and slip in the tape spring.

Aspects of the present disclosure can include the plurality of rotary pins, the plurality of sub-rollers coupled to the plurality of rotary pins, and the plurality of a flat spring configured to press the plurality of rotary pins, which can more effectively suppress the occurrence of a gap and slip in the tape spring.

Other detailed matters of the example embodiments of the present disclosure are included in the detailed description and the drawings.

According to aspects of the present disclosure, the movement distance of the tape spring can be measured by the photo sensor, such that the winding and unwinding motions of the display device can be more precisely controlled.

The effects according to aspects of the present disclosure are not limited to the above-mentioned effects, and more various effects are included in the present disclosure.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1A:
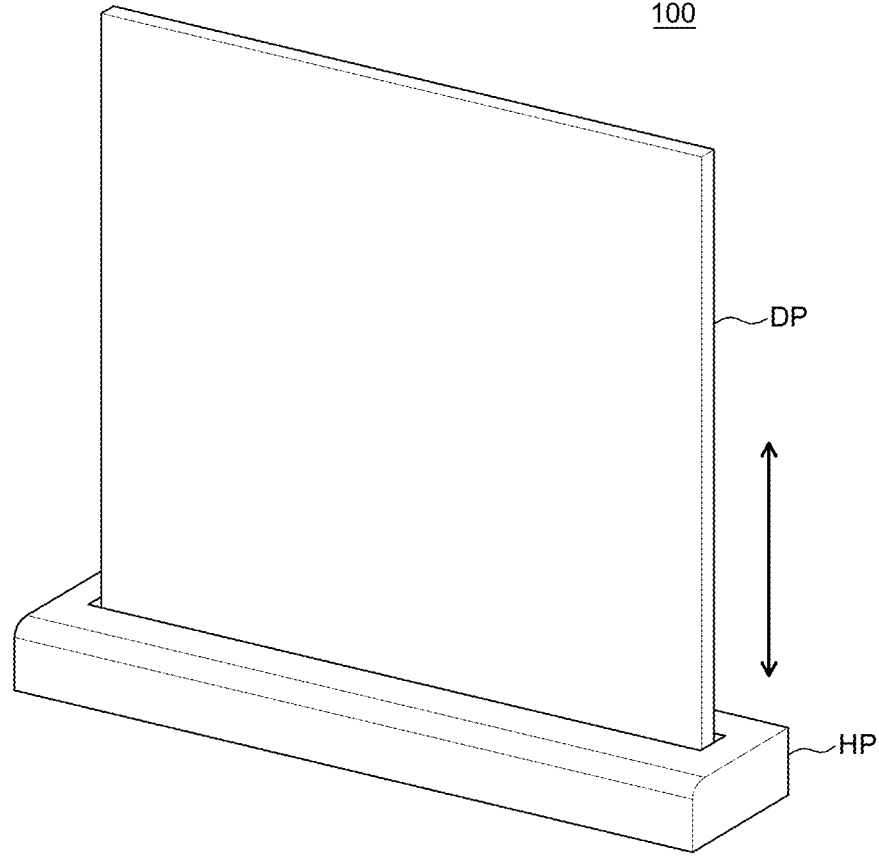
FIGS. 1A and 1B are perspective views of a display device according to an embodiment of the present disclosure.

Advantages and characteristics of the present disclosure and a method of achieving the advantages and characteristics will be clear by referring to example embodiments described below in detail together with the accompanying drawings. However, the present disclosure is not limited to the example embodiments disclosed herein but will be implemented in various forms. The example embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the example embodiments of the present disclosure are merely examples, and the present disclosure is not limited thereto. Like reference numerals generally denote like elements throughout the disclosure. Further, in the following description of the present disclosure, a detailed explanation of known related technologies can be omitted to avoid unnecessarily obscuring the subject matter of the present disclosure. The terms such as "including," "having," and "consist of" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms. These terms are merely used for distinguishing one component from the other components. Therefore, a first component to be mentioned below can be a second component in a technical concept of the present disclosure.

Like reference numerals generally denote like elements throughout the disclosure.

A size and a thickness of each component illustrated in the drawing are illustrated for convenience of description, and the present disclosure is not limited to the size and the thickness of the component illustrated. Further, the term "can" fully encompasses all the meanings and coverages of the term "may."

The features of various embodiments of the present disclosure can be partially or entirely adhered to or combined with each other and can be interlocked and operated in technically various ways, and the embodiments can be carried out independently of or in association with each other.

Hereinafter, a display device according to example embodiments of the present disclosure will be described in detail with reference to accompanying drawings. All the components of each display device according to all embodiments of the present disclosure are operatively coupled and configured.

<Display Device—Rollable Display Device>

Figure 1B:
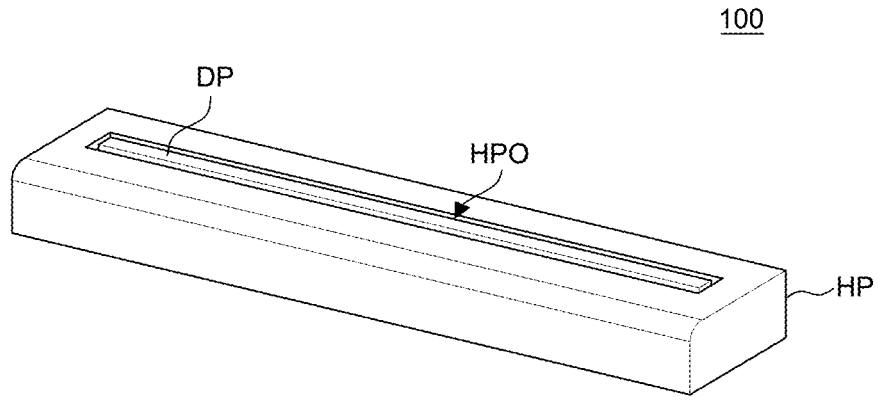

FIGS. 1A and 1B are perspective views of a display device according to an embodiment of the present disclosure.

With reference to FIGS. 1A and 1B, a display device 100 according to an embodiment of the present disclosure includes a display part DP and a housing part HP.

The display part DP is configured to display images to a user. For example, display elements and circuits, lines, and components for operating the display elements can be disposed on the display part DP. In this case, because the display device 100 according to the embodiment of the present disclosure is a rollable display device 100, the display part DP can be configured to be wound or unwound. For example, the display part DP can include a display panel 120 having flexibility so as to be wound or unwound, and a plurality of back bars 110. A more detailed description of the display part DP will be described below with reference to FIGS. 2A and 2B.

The housing part HP is a casing capable of accommodating the display part DP. The display part DP can be wound and accommodated in the housing part HP. The display part DP can be unwound and disposed outside the housing part HP.

The housing part HP has an opening portion HPO through which the display part DP can move to the outside or the inside of the housing part HP. The display part DP can move in an upward/downward direction while passing through the opening portion HPO of the housing part HP.

Meanwhile, the display part DP of the display device 100 can switch from a fully unwound state to a fully wound state or switch from the fully wound state to the fully unwound state.

FIG. 1A illustrates that the display part DP of the display device 100 is in the fully unwound state. The fully unwound state is a state in which the display part DP of the display device 100 is disposed outside the housing part HP. For example, the fully unwound state can be defined as a state in which the display part DP is maximally unwound and disposed outside the housing part HP and cannot be unwound any further in order to allow a user to see the image on the display device 100.

FIG. 1B illustrates that the display part DP of the display device 100 is in the fully wound state. The fully wound state is a state in which the display part DP of the display device 100 is accommodated in the housing part HP and cannot be wound any further. For example, the configuration in which the display part DP is not disposed outside the housing part HP is advantageous in terms of an external appearance when the user does not see the image on the display device 100. Therefore, the fully wound state can be defined as a state in which the display part DP is wound and accommodated in the housing part HP. In addition, in the fully wound state in which the display part DP is accommodated in the housing part HP, the volume of the display device 100 decreases, and the display device 100 can be easy to transport.

<Display Part>

Figure 2A:
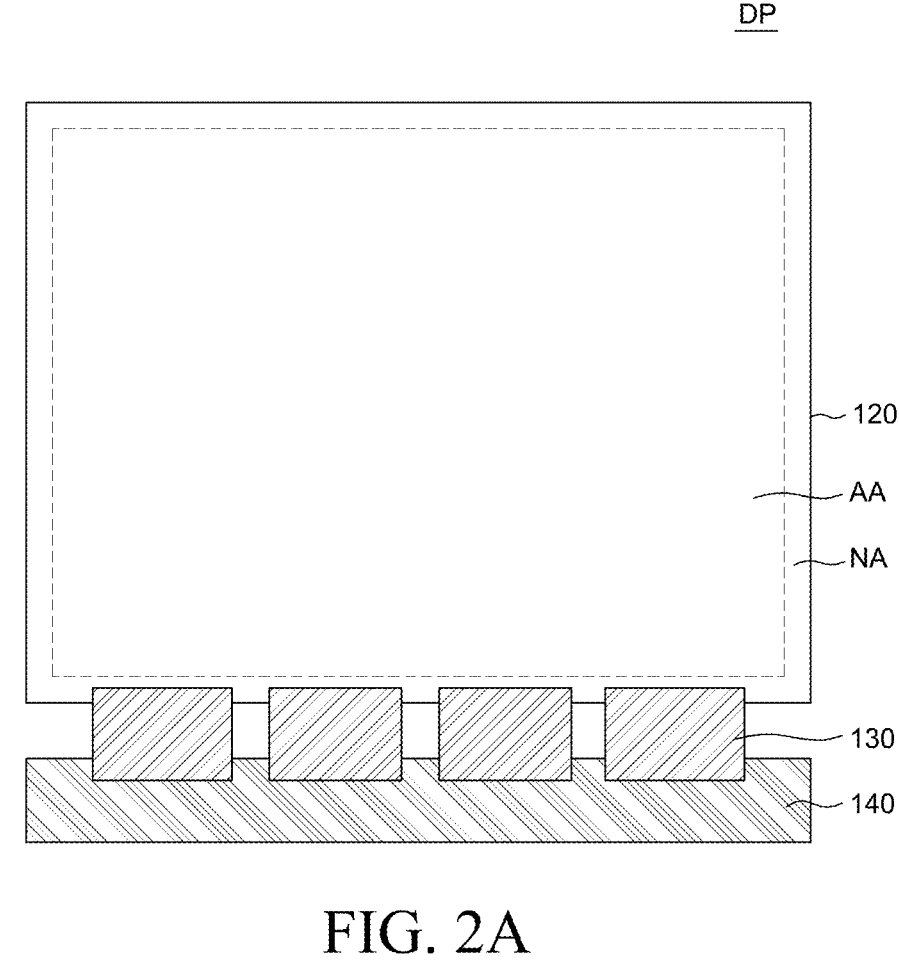
FIG. 2A is a top plan view of a display part of the display device according to the embodiment of the present disclosure.
Figure 2B:
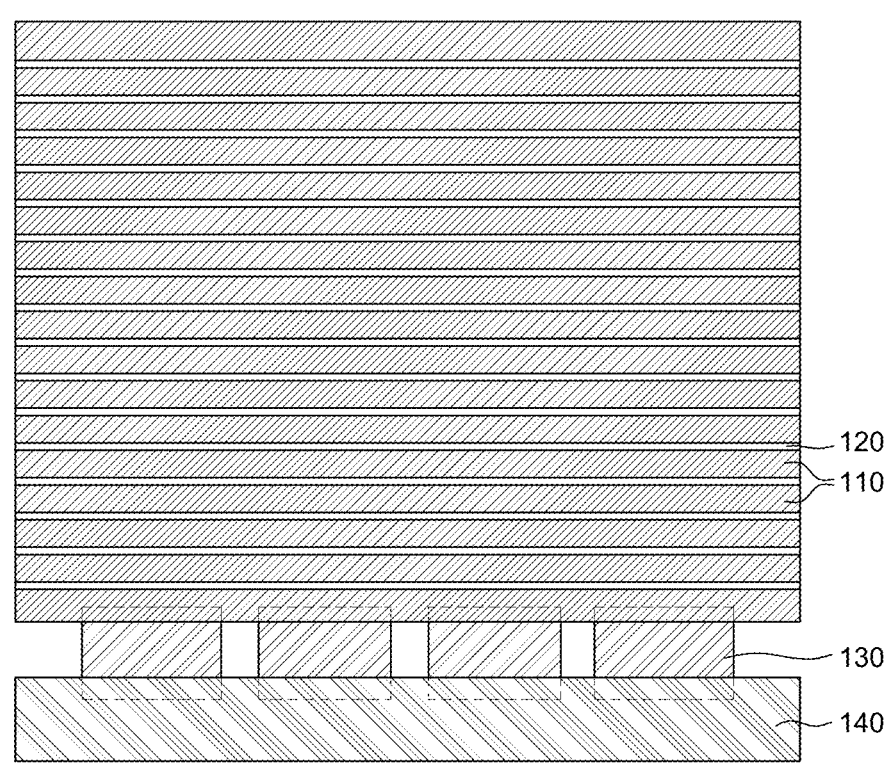
FIG. 2B is a rear view of the display part of the display device according to the embodiment of the present disclosure.
Figure 2B:
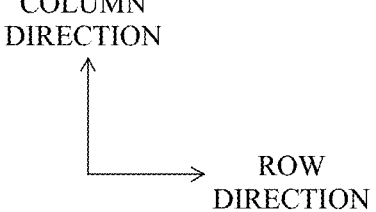

FIG. 2A is a top plan view of the display part of the display device according to the embodiment of the present disclosure. FIG. 2B is a rear view of the display part of the display device according to the embodiment of the present disclosure.

With reference to FIGS. 2A and 2B, the display part DP of the display device 100 includes the plurality of back bars 110, the display panel 120, flexible films 130, and a printed circuit board 140.

The display panel 120 is a panel configured to display images to a user. The display panel 120 can include a display element configured to display images, a driving element configured to operate the display element, and lines configured to transmit various types of signals to the display element and the driving element.

Different display elements can be defined depending on the types of display panels 120. For example, in case that the display panel 120 is an organic light-emitting display panel, the display element can be an organic light-emitting element including an anode, an organic light-emitting layer, and a cathode. For example, in case that the display panel 120 is a liquid crystal display panel, the display element can be a liquid crystal display element. In addition, in case that the display panel 120 is a light-emitting display panel including an LED, the display element can be the LED. Hereinafter, the assumption is made that the display panel 120 is the organic light-emitting display panel. However, the display panel 120 is not limited to the organic light-emitting display panel. In addition, because the display device 100 according to the embodiment of the present disclosure is a rollable display device, the display panel 120 can be implemented as a flexible display panel so as to be wound around or unwound from a roller part.

With reference to FIG. 2A, the display panel 120 includes a display area AA (active area) and a non-display area NA (non-active area).

The display area AA is an area of the display panel 120 in which images are displayed. The display area AA can include a plurality of subpixels constituting a plurality of pixels, and a drive circuit configured to operate the plurality of subpixels. The plurality of subpixels is minimum units constituting the display area AA. The display element can be disposed in each of the plurality of subpixels. For example, the plurality of subpixels can each include the light-emitting element including the anode, a light-emitting layer, and a cathode. However, the present disclosure is not limited thereto. In addition, the circuit configured to operate the plurality of subpixels can include driving elements, lines, and the like. For example, the circuit can include a thin-film transistor, a storage capacitor, a gate line, a data line, and the like. However, the present disclosure is not limited thereto.

The non-display area NA is an area in which no image is displayed. The non-display area NA is disposed to surround an outer periphery of the display area AA. The non-display area NA can surround the display area AA entirely or only in parts. Various lines and circuits for operating the organic light-emitting element in the display area AA are disposed in the non-display area NA. For example, the non-display area NA can include link lines for transmitting signals to the plurality of subpixels and the circuit in the display area AA. The non-display area NA can include a drive IC such as a gate driver IC and a data driver IC. However, the present disclosure is not limited thereto.

The flexible film 130 is a film having various types of components disposed on a base film having flexibility. The flexible film 130 can have ductility. A partial area of the flexible film 130, together with the display panel 120, can be wound around or unwound from the roller part. The flexible film 130 can supply signals to the plurality of subpixels and the circuit in the display area AA. The flexible film 130 can be electrically connected to the display panel 120. The flexible film 130 is disposed at one end of the non-display area NA of the display panel 120 and supplies a power voltage, a data voltage, and the like to the plurality of subpixels and the circuit in the display area AA. The number of flexible films 130 illustrated in FIG. 2A is an example, and the number of flexible films 130 can be variously changed in accordance with design. However, the present disclosure is not limited thereto.

Meanwhile, for example, the drive IC such as the gate driver IC and the data driver IC can also be disposed on the flexible film 130. A drive integrated circuit (IC) is a component configured to process data for displaying the image and process a driving signal for processing the data. The drive IC can be disposed in ways such as a chip-on-glass (COG) method, a chip-on-film (COF) method, and a tape carrier package (TCP) method depending on how the drive IC is mounted. However, for the convenience of description, the configuration has been described in which the drive IC is mounted on the flexible film 130 by the chip-on-film method. However, the present disclosure is not limited thereto.

The printed circuit board 140 is disposed at one end of the flexible film 130 and connected to the flexible film 130. The printed circuit board 140 is a component for supplying a signal to the drive IC. The printed circuit board 140 supplies various signals, such as driving signals and data signals, to the drive IC. Various types of components can be disposed on the printed circuit board 140. For example, a timing controller, a power source unit, and the like can be disposed on the printed circuit board 140. FIG. 2A illustrates one printed circuit board 140. However, the number of printed circuit boards 140 can be variously changed in accordance with design. The present disclosure is not limited thereto.

Further, an additional printed circuit board connected to the printed circuit board 140 can be further disposed. For example, the printed circuit board 140 can be called a source printed circuit board (source PCB (S-PCB)) on which a data drive part is mounted. The additional printed circuit board connected to the printed circuit board 140 can be called a control printed circuit board (control PCB (C-PCB)) on which the timing controller and the like are mounted. The additional printed circuit board can be disposed in the roller part. The additional printed circuit board can be provided outside the roller part and disposed inside the housing part HP.

With reference to FIG. 2B, the plurality of back bars 110 can be disposed on a rear surface of the display panel 120. The plurality of back bars 110 can support the display panel 120. When the display panel 120 is wound around or unwound from the roller part, supporting forces of the back bar 110 can support the display panel 120 and inhibit the display panel 120 from being scratched and damaged. The plurality of back bars 110 can each be referred to as an apron. The plurality of back bars 110 can be made of a plastic material. However, the present disclosure is not limited thereto. Meanwhile, the plurality of back bars 110 can be attached using a separate bonding layer or a foam tape.

The plurality of back bars 110 can be disposed on the rear surface of the display panel 120 and spaced apart from each other. Therefore, a part of the rear surface of the display panel 120 can be exposed by spaces spaced apart from one another between the plurality of back bars 110. However, the present disclosure is not limited thereto. For example, the plurality of back bars 110 can be disposed to adjoin one another, such that the rear surface of the display panel 120 may not be exposed by the plurality of back bars 110.

FIGS. 2A and 2B illustrate that the plurality of back bars 110 are disposed on the rear surface of the display panel 120. However, a back cover having a plurality of opening portions can be additionally disposed between the display panel 120 and the plurality of back bars 110. In addition, only the back cover can be used without the plurality of back bars 110.

<Structure of Display Device>

Figure 3A:
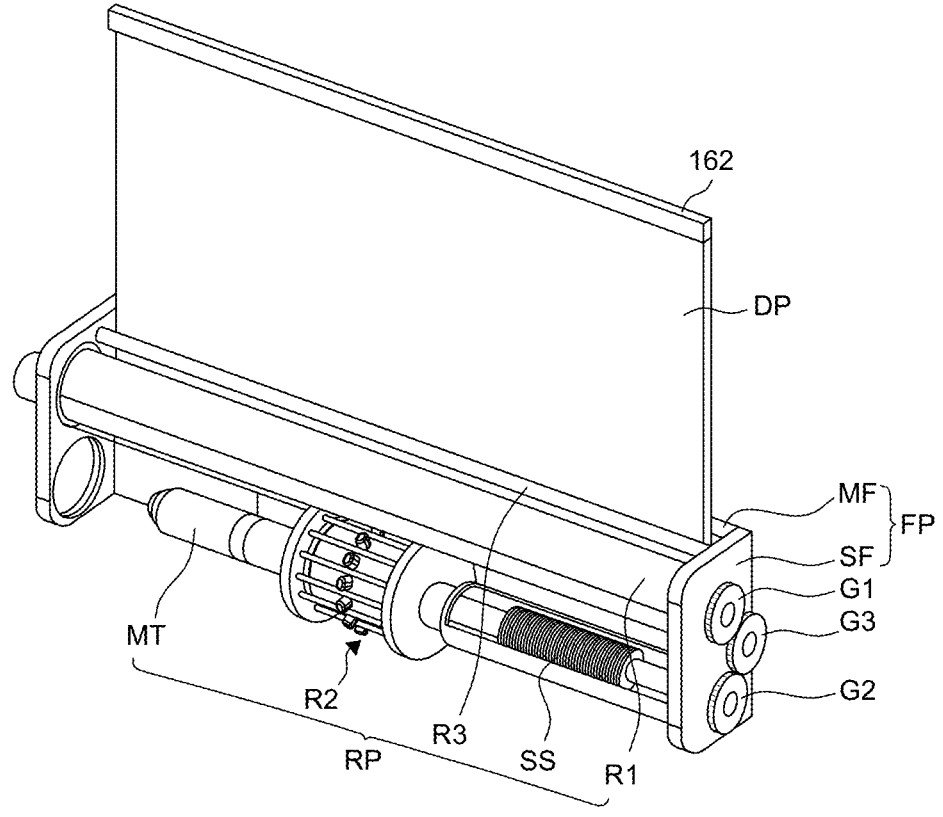
FIG. 3A is a front perspective view of the display device according to the embodiment of the present disclosure.
Figure 3B:
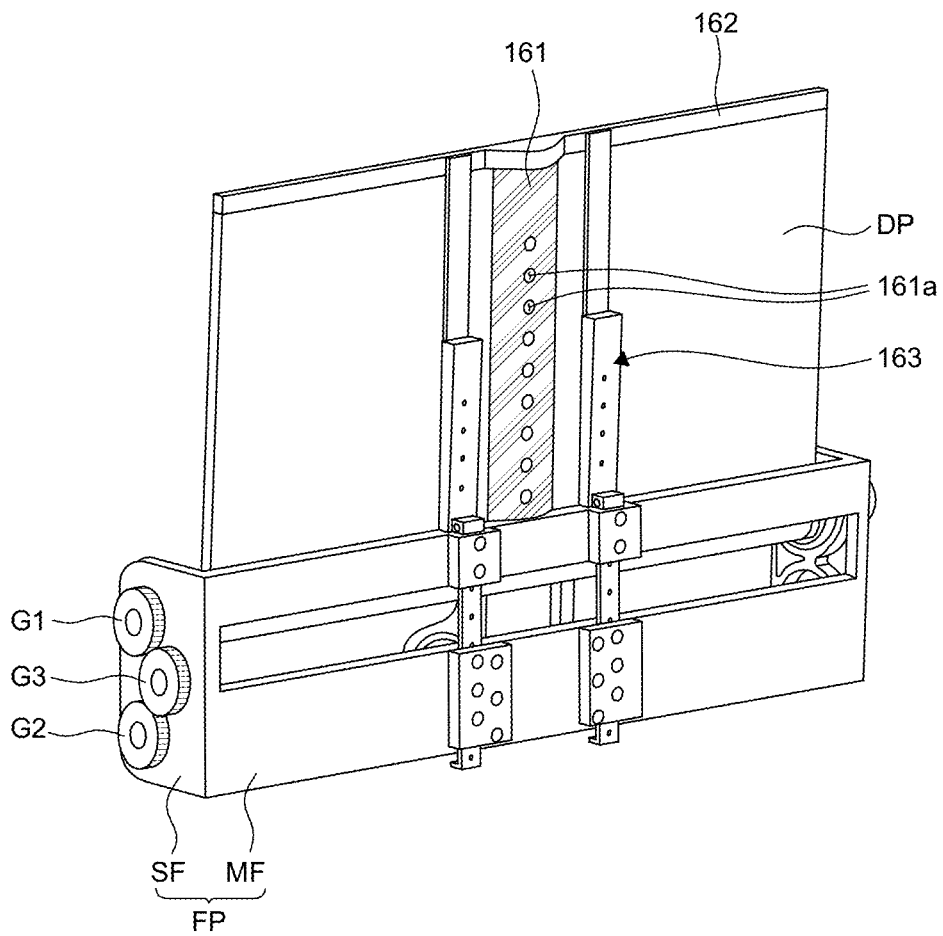
FIG. 3B is a rear perspective view of the display device according to the embodiment of the present disclosure.

FIG. 3A is a front perspective view of the display device according to the embodiment of the present disclosure. FIG. 3B is a rear perspective view of the display device according to the embodiment of the present disclosure.

With reference to FIGS. 3A and 3B, the display device 100 includes the display part DP, a roller part RP, a frame part FP, a tape spring 161, a head bar 162, and a slide part 163.

The roller part RP includes a first roller R1, a second roller R2, a third roller R3, a motor MT, and a spiral spring SS.

The first roller R1 is configured to rotate clockwise or counterclockwise. Therefore, the first roller R1 can wind or unwind the display part DP. The first roller R1 can have a cylindrical shape. However, the present disclosure is not limited thereto.

The second roller R2 is configured to rotate clockwise or counterclockwise. Therefore, the second roller R2 can wind or unwind the tape spring 161. The second roller R2 can be disposed below the first roller R1. However, the present disclosure is not limited thereto. The second roller R2 will be described below with reference to FIGS. 4 and 5.

The third roller R3 is configured to rotate clockwise or counterclockwise. The third roller R3 is disposed adjacent to the first roller R1. The third roller R3 can be disposed in a route along which the display part DP is wound or unwound. Therefore, the third roller R3 can guide the winding or unwinding motion of the display part DP.

The motor MT can be disposed at one end of the second roller R2 and connected to the second roller R2. The motor MT can rotate the first roller R1, the second roller R2, and the third roller R3 of the roller part RP clockwise or counterclockwise. The motor MT can be connected to a power source part such as a separate external power source, an embedded battery, or the like and supplied with power.

The spiral spring SS can be disposed at the other end of the second roller R2 and connected to the second roller R2. The spiral spring SS is a member having an elastic force. When the spiral spring SS is wound or unwound, the spiral spring SS can maintain the display part DP in a flat state while applying tension to the display part DP. Specifically, the spiral spring SS can apply a force in a winding direction of the roller part RP by using tension of the spring. For example, the elastic force accumulated in the spiral spring SS can increase when the display part DP is wound. Therefore, when the display part DP is fully unwound, the tension is applied to the display part DP, such that the display part DP can be kept flat. Further, the display part DP can be more easily wound. In addition, the display part DP can be more easily unwound by the elastic force of the spiral spring SS.

The frame part FP is coupled to the roller part RP and configured to support the roller part RP. The frame part FP includes a main frame MF and side frames SF provided at two opposite sides of the main frame MF. The slide part 163 is coupled to the main frame MF. The roller part RP is coupled to the side frames SF.

The frame part FP can include a first gear G1, a second gear G2, and a third gear G3 coupled to the side frame SF. The first gear G1 can be connected to an end of the first roller R1 and configured to rotate together with the first roller R1. The second gear G2 can be connected to an end of the spiral spring Ss connected to the second roller R2, and the second gear G2 can be configured to rotate together with the second roller R2. The third gear G3 can be disposed between the first gear G1 and the second gear G2 and configured to engage with the first gear G1 and the second gear G2. Therefore, the rotation of the motor MT can be sequentially transmitted to the second roller R2, the spiral spring SS, the second gear G2, the third gear G3, and the first gear G1. Further, the first roller R1 and the second roller R2 can be rotated together by the rotations of the second gear G2, the third gear G3, and the first gear G1.

The tape spring 161 can move the display part DP in an upward/downward direction in conjunction with the operation of the roller part RP. The tape spring 161 is disposed on a rear surface of the display part DP. An upper end of the tape spring 161 is fixed to an upper end of the display panel 120, and a lower end of the tape spring 161 is fixed to the second roller R2. Therefore, the tape spring 161 can be wound around or unwound from the second roller R2 and move the display part DP in the upward/downward direction in conjunction with the operation of the roller part RP.

The tape spring 161 can be a bistable reeled composite (BRC) member. The tape spring 161 can be wound or unwound in a column direction, i.e., a longitudinal direction of the tape spring 161 while being rolled or unrolled in a row direction, i.e., a width direction of the tape spring 161. When the tape spring 161 is kept unrolled (flat) in the row direction, the tape spring 161 is wound in the column direction. On the contrary, when the tape spring 161 is kept rolled in the row direction, the tape spring 161 has rigidity in the column direction and thus is unrolled in the longitudinal direction.

In this case, the rigidity of the tape spring 161 in the column direction is related to a degree to which the tape spring 161 is rolled in the row direction. For example, the degree to which the tape spring 161 is rolled in the row direction can be appropriately selected depending on the rigidity in the column direction required for the display part DP.

In the display device 100 according to the embodiment of the present disclosure, the tape spring 161 is unrolled or rolled in the row direction, such that the tape spring 161 can be wound or unwound in the column direction. Specifically, when the roller part RP is wound, the tape spring 161 can be wound around the second roller R2 while being wound in the column direction. In this case, the display panel 120 can be wound around the first roller R1 while moving together with the tape spring 161. In addition, when the roller part RP is unwound, the tape spring 161 can be unwound from the second roller R2 while being unwound in the column direction. In this case, the display panel 120 can be unwound from the first roller R1 while moving together with the tape spring 161.

In addition, when the roller part RP performs the unwinding operation, the tape spring 161, which is unwound in the column direction, can have rigidity in the column direction, thereby restricting swaying and torsion of the unwound display panel 120. Therefore, the unwound display panel 120 can be kept flat by the rigidity of the tape spring 161 as long as other external forces are applied.

Meanwhile, the tape spring 161 includes a plurality of guide holes 161a. The plurality of guide holes 161a can be formed through the tape spring 161. The plurality of guide holes 161a can be disposed in a longitudinal direction of the tape spring 161. For example, the plurality of guide holes 161a can be disposed in the column direction of the tape spring 161. The plurality of guide holes 161a can be formed to be spaced apart from one another at predetermined intervals. However, the present disclosure is not limited thereto. In addition, the plurality of guide holes 161a can each have an elliptical shape. However, the present disclosure is not limited thereto.

The plurality of guide holes 161a can correspond to a plurality of guide protrusions 151a of a tape spring drum 151 to be described below. When the tape spring 161 is wound around the tape spring drum 151, the plurality of guide protrusions 151a can be inserted into the plurality of guide holes 161a. For example, the operation of winding the tape spring 161 around the tape spring drum 151 can be more smoothly guided by the plurality of guide holes 161a and the plurality of guide protrusions 151a. Therefore, it is possible to suppress the occurrence of a gap or slip in the tape spring 161 when the tape spring 161 is wound around or unwound from the tape spring drum 151.

The head bar 162 can be disposed at an uppermost end of the display part DP. The head bar 162 is disposed to fix the display part DP and an upper end of the tape spring 161. The head bar 162 covers only a part of a surface of the display part DP adjacent to an edge of the uppermost end of the display part DP so as not to cover the image displayed on a front surface of the display part DP. For example, the display part DP and the head bar 162 can be fixed by a screw. However, the present disclosure is not limited thereto.

The slide part 163 is disposed on the rear surface of the display part DP. One end of the slide part 163 can be fixed to the main frame MF, and the other end of the slide part 163 can be fixed to the head bar 162. The slide part 163 can be provided as a pair of slide parts 163 respectively disposed at two opposite sides of the tape spring 161 one by one. However, the present disclosure is not limited thereto. For example, the slide part 163 can slide to be extended or contracted over three steps. The slide part 163, together with the tape spring 161, can move the display part DP in the upward/downward direction. In addition, when the display part DP is unwound, the slide part 163 can suppress the swaying of the display part DP and support the display part DP.

<Structure of Second Roller>

Figure 4:
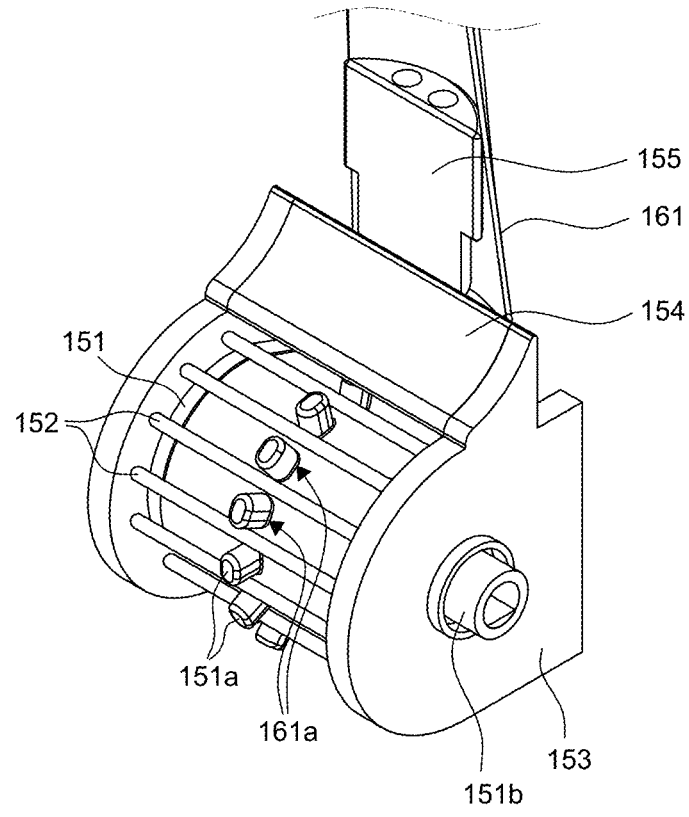
FIG. 4 is a perspective view of a second roller of the display device according to the embodiment of the present disclosure.
Figure 5:
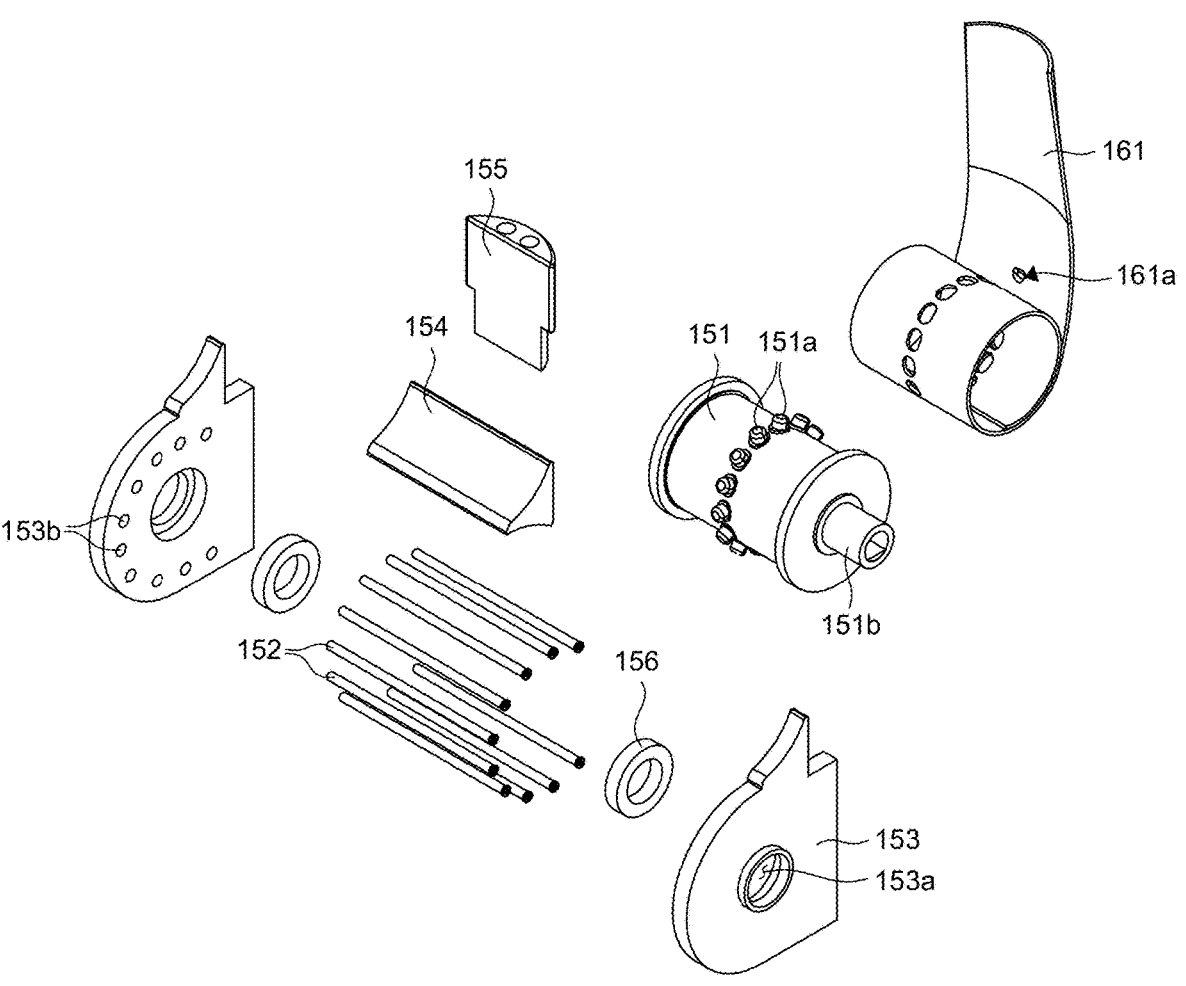
FIG. 5 is an exploded perspective view of the second roller of the display device according to the embodiment of the present disclosure.

FIG. 4 is a perspective view of the second roller of the display device according to the embodiment of the present disclosure. FIG. 5 is an exploded perspective view of the second roller of the display device according to the embodiment of the present disclosure.

With reference to FIGS. 4 and 5, the second roller R2 includes the tape spring drum 151, a plurality of rotary pins 152, tape spring side frames 153, a coupling part 154, a tape spring guide 155, and bearings 156.

The tape spring drum 151 has a cylindrical shape, and one side of the tape spring drum 151 can be connected to the motor MT. Therefore, the tape spring drum 151 can be rotated clockwise or counterclockwise by the operation of the motor MT. One end of the tape spring 161 is fixed to the tape spring drum 151. When the tape spring drum 151 is rotated clockwise or counterclockwise by the motor MT, the tape spring 161 fixed to the tape spring drum 151 can be wound around or unwound from the tape spring drum 151.

For example, the tape spring drum 151 can be configured to wind or unwind the tape spring 161.

The tape spring drum 151 includes the plurality of guide protrusions 151a. The plurality of guide protrusions 151a can be disposed in the column direction along an outer peripheral surface of the tape spring drum 151 around which the tape spring 161 is wound. The plurality of guide protrusions 151a can be formed to protrude from the outer peripheral surface of the tape spring drum 151. The plurality of guide protrusions 151a can be formed to be spaced apart from one another at predetermined intervals. However, the present disclosure is not limited thereto. In addition, the plurality of guide protrusions 151a can be formed in shapes corresponding to the plurality of guide holes 161a. However, the present disclosure is not limited thereto.

The plurality of guide protrusions 151a can correspond to the plurality of guide holes 161a. The plurality of guide protrusions 151a can be inserted into the plurality of guide holes 161a when the tape spring 161 is wound around the tape spring drum 151. Therefore, when the tape spring drum 151 rotates, the tape spring 161 can be wound around or unwound from the tape spring drum 151 by a predetermined amount. Therefore, it is possible to suppress the occurrence of a gap and slip in the tape spring.

The tape spring drum 151 includes a tape spring drum extension portion 151b extending outward. For example, the tape spring drum extension portion 151b can be disposed in a shape protruding outward from the tape spring drum 151. Further, the spiral spring SS can be coupled to the tape spring drum extension portion 151b. Therefore, when the spiral spring SS is wound or unwound, the spiral spring SS can maintain the display part DP in a flat state while applying tension to the display part DP.

The plurality of rotary pins 152 is disposed along the outer peripheral surface of the tape spring drum 151. The plurality of rotary pins 152 is disposed to be spaced apart from the tape spring drum 151. The plurality of rotary pins 152 can rotate clockwise or counterclockwise. In this case, rotation axes of the plurality of rotary pins 152 and a rotation axis of the tape spring drum 151 can be parallel to one another. However, because the plurality of rotary pins 152 is not connected to the motor MT, the rotations of the plurality of rotary pins 152 are not performed by the motor MT. The plurality of rotary pins 152 can be disposed outside an area in which the tape spring 161 is wound. The plurality of rotary pins 152 can be disposed to surround the outer peripheral surface of the tape spring drum 151. Therefore, even though the tape spring 161 and the plurality of rotary pins 152 adjoin one another, friction between the tape spring 161 and the plurality of rotary pins 152 can be minimized.

Specifically, when the tape spring 161 is wound or unwound, the tape spring 161 can be partially separated without being completely tightly attached to the tape spring drum 151 in the direction of the tape spring drum 151. In this case, because the plurality of rotary pins 152, which are rotatable, are disposed outside the tape spring drum 151, the plurality of rotary pins 152 can also rotate in accordance with the movement of the tape spring 161 even though the tape spring 161 and the plurality of rotary pins 152 adjoin one another. Therefore, friction, which can occur when the tape spring 161 is wound or unwound, can be suppressed, and the tape spring 161 can be more stably wound and unwound.

The tape spring side frames 153 are provided as a pair of tape spring side frames 153 provided at two opposite sides of the tape spring drum 151. The pair of tape spring side frames 153 can cover side surfaces of the tape spring drum 151, side surfaces of the plurality of rotary pins 152, and side surfaces of the tape spring 161 wound around the tape spring drum 151. The pair of tape spring side frames 153 can be disposed to be opposite to each other.

The pair of tape spring side frames 153 can be respectively coupled to two opposite ends of the tape spring drum 151 and two opposite ends of the plurality of rotary pins 152. The pair of tape spring side frames 153 can each include a first hole 153a coupled to an end of the tape spring drum 151, and a plurality of second holes 153b coupled to ends of the plurality of rotary pins 152. The plurality of second holes 153b can be spaced apart from one another to correspond to the plurality of rotary pins 152. However, the present disclosure is not limited thereto.

The coupling part 154 is disposed above the tape spring drum 151 and coupled to the pair of tape spring side frames 153. For example, the coupling part 154 can be coupled to the pair of tape spring side frames 153 and connect the pair of tape spring side frames 153. FIGS. 4 and 5 illustrate that the pair of tape spring side frames 153 and the coupling part 154 are provided separately. However, the present disclosure is not limited thereto. For example, the pair of tape spring side frames 153 and the coupling part 154 can be integrated.

The tape spring guide 155 is disposed above the coupling part 154. The tape spring guide 155 can be connected to the coupling part 154 so as to correspond to a position of the tape spring 161. Therefore, the tape spring guide 155 can guide the winding or unwinding motion of the tape spring 161. In addition, the tape spring guide 155 can suppress the swaying of the tape spring 161 and securely support the tape spring 161.

The bearing 156 is disposed between the tape spring drum 151 and the tape spring side frame 153. The bearings 156 can be coupled to two opposite sides of the tape spring drum 151. The bearings 156 can support two opposite sides of the tape spring drum 151 so that the tape spring drum 151 can rotate relative to the tape spring side frame 153. The rotation of the tape spring drum 151 can be easily performed by the bearings 156. FIGS. 4 and 5 illustrate that the second roller R2 includes the bearings 156. However, in some instances, the bearing 156 can be excluded.

Meanwhile, bearings can also be disposed between the plurality of rotary pins 152 and the tape spring side frames 153. The bearings can be coupled to the two opposite sides of the plurality of rotary pins 152 to allow the plurality of rotary pins 152 to easily rotate relative to the tape spring side frames 153. However, the present disclosure is not limited thereto.

Various operating environments can make it somewhat difficult for the tape spring to be wound or unwound always with predetermined tension while the tape spring is wound around or unwound from the tape spring drum. For example, an outer diameter of the tape spring, which is wound around the tape spring drum, can decrease during the winding operation and increases during the unwinding operation. Therefore, a gap can be formed in the tape spring wound around the tape spring drum. For example, a separation space can be formed between a tape spring part, which is primarily wound around the tape spring drum, and a tape spring part secondarily wound around the tape spring drum. The gap can cause a slip by which a position of the tape spring is misaligned, which can cause a slip even between the tape spring and the display part. This can eventually cause a slip which partially changes a speed of the display part while the display part moves upward or downward, which can degrade the quality of the display device. In addition, the gap can cause friction between the tape spring and the casing configured to accommodate the tape spring drum. For example, in case that the outer diameter of the tape spring wound around the tape spring drum increases, the tape spring can adjoin an inner surface of the casing, which can cause friction. This causes the unstable winding and unwinding motions of the tape spring and degrades the durability of the display device.

In the display device 100 according to the embodiment of the present disclosure, the tape spring 161 includes the plurality of guide holes 161a, and the tape spring drum 151 includes the plurality of guide protrusions 151a. When the tape spring 161 is wound around the tape spring drum 151, the plurality of guide protrusions 151a of the tape spring drum 151 can be inserted into the plurality of guide holes 161a of the tape spring 161. For example, the operation of winding or unwinding the tape spring 161 around or from the tape spring drum 151 can be guided by the process in which the plurality of guide protrusions 151a are inserted into the plurality of guide holes 161a.

Specifically, when the tape spring drum 151 rotates, the tape spring 161 can physically move by a predetermined amount. In other words, a degree to which the tape spring 161 is wound or unwound can be constantly maintained while the tape spring drum 151 rotates. In addition, because the plurality of guide protrusions 151a are inserted into the plurality of guide holes 161a, the tape spring 161 can be kept stably wound around the tape spring drum 151. Therefore, it is possible to suppress the occurrence of a gap in the wound tape spring 161. In addition, because the occurrence of a gap is suppressed, a slip between the tape spring 161 and the display part DP can be suppressed. Therefore, the display part DP can be stably moved upward or downward by the tape spring 161, which can improve the quality of the display device 100.

The display device 100 according to the embodiment of the present disclosure includes the plurality of rotary pins 152 spaced apart from the tape spring drum 151 and disposed to surround the outer peripheral surface of the tape spring drum 151. In this case, the plurality of rotary pins 152 can rotate in conjunction with the movement of the tape spring 161. Specifically, in case that the plurality of rotary pins 152 and the wound or unwound tape spring 161 adjoin one another, the plurality of rotary pins 152 can be rotated clockwise or counterclockwise by the movement of the tape spring 161. Therefore, even though the plurality of rotary pins 152 and the tape spring 161 adjoin one another, the tape spring 161 can be smoothly wound or unwound by the plurality of rotatable rotary pins 152. Therefore, the friction between the plurality of rotary pins 152 and the tape spring 161 can be minimized, and the durability of the display device 100 can be improved. In addition, a separate casing for accommodating the tape spring drum 151 can be excluded, which can reduce the weight of the display device 100.

Figure 6:
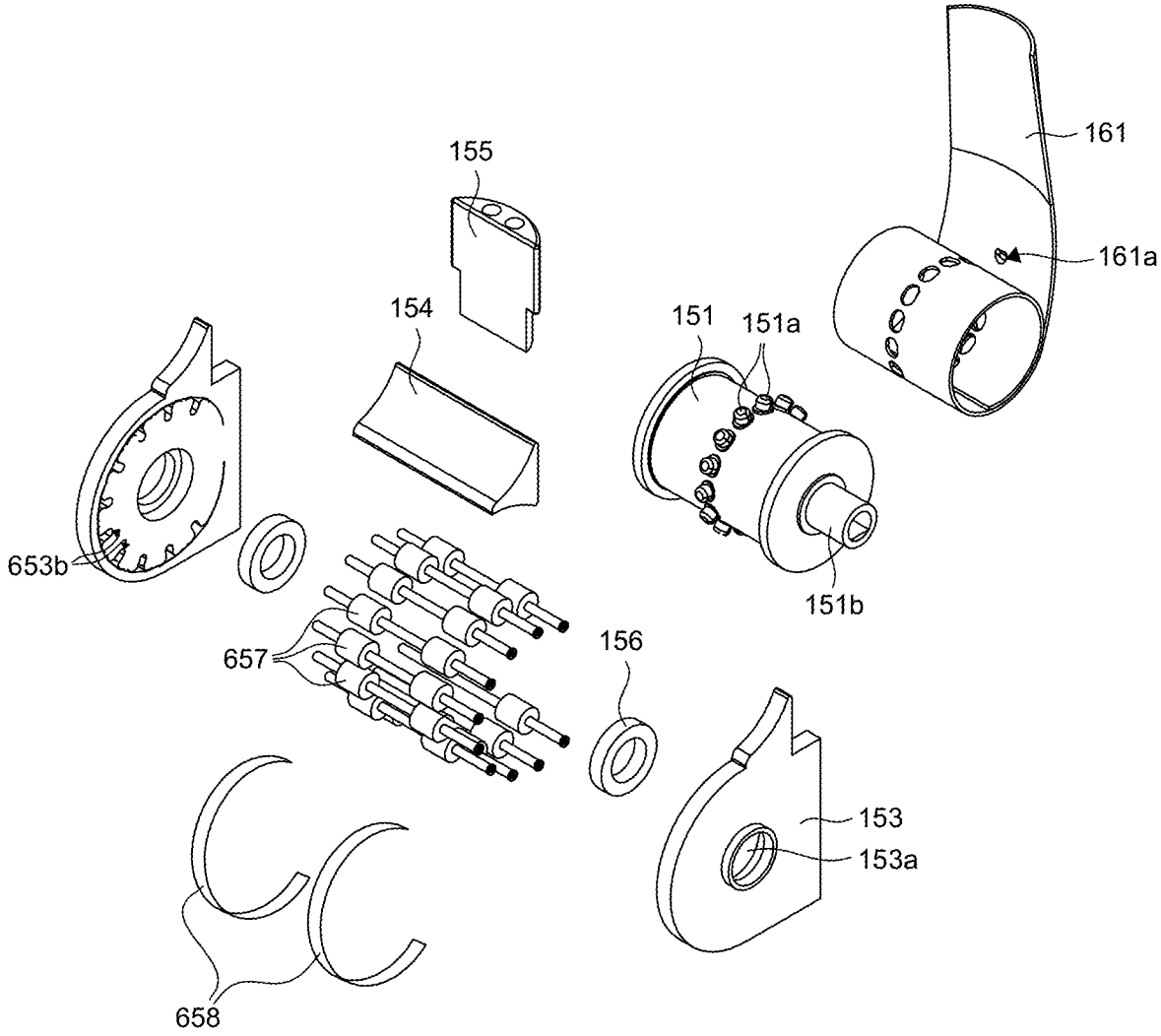
FIG. 6 is an exploded perspective view of a second roller of a display device according to another embodiment of the present disclosure.
Figure 7:
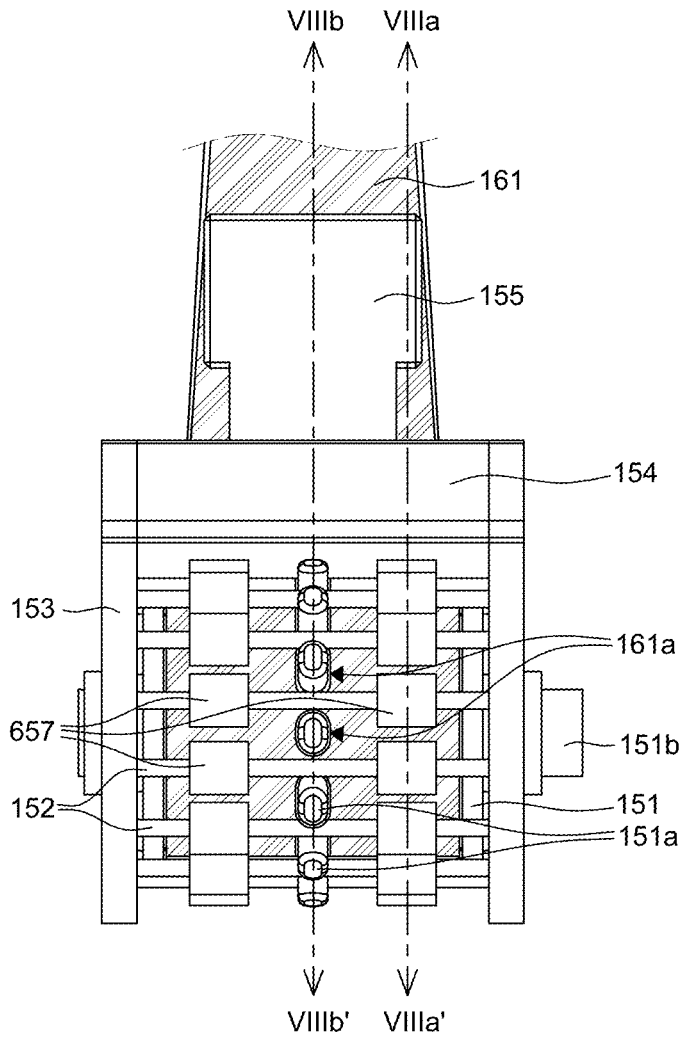
FIG. 7 is a top plan view of the second roller of the display device according to another embodiment of the present disclosure.
Figure 8A:
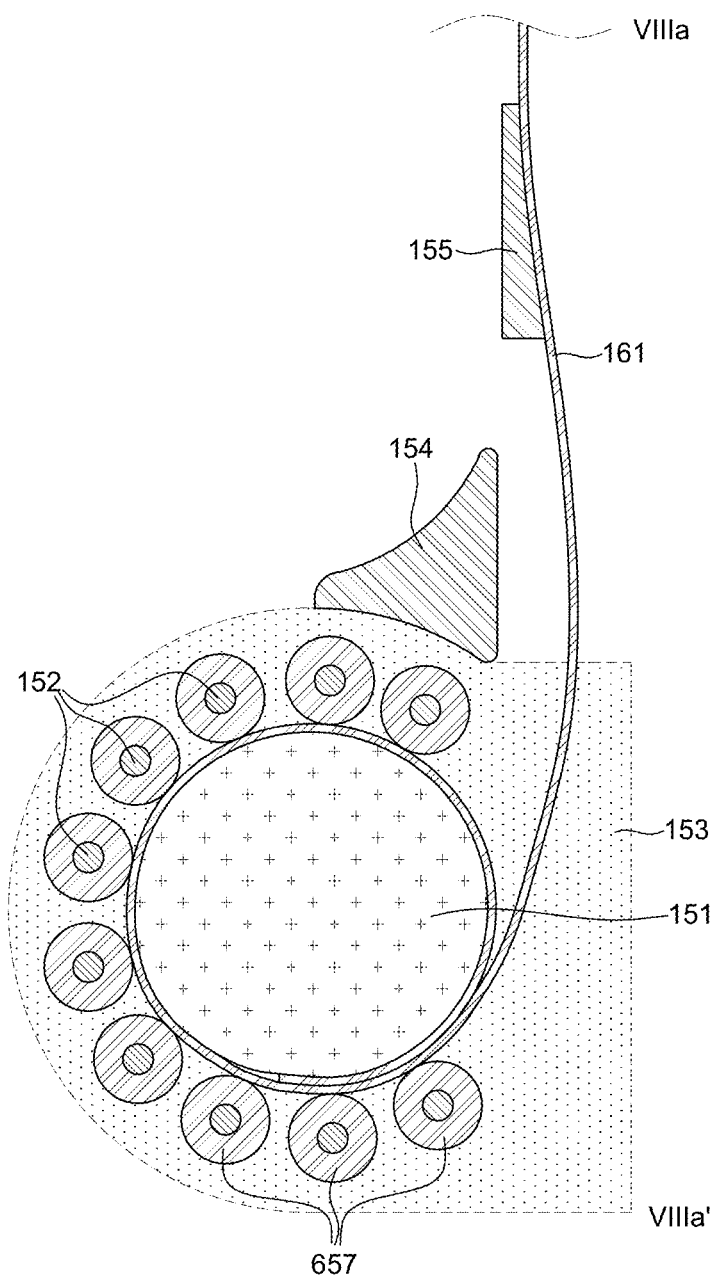
FIG. 8A is a cross-sectional view taken along line VIIIa-VIIIa' in FIG. 7.
Figure 8B:
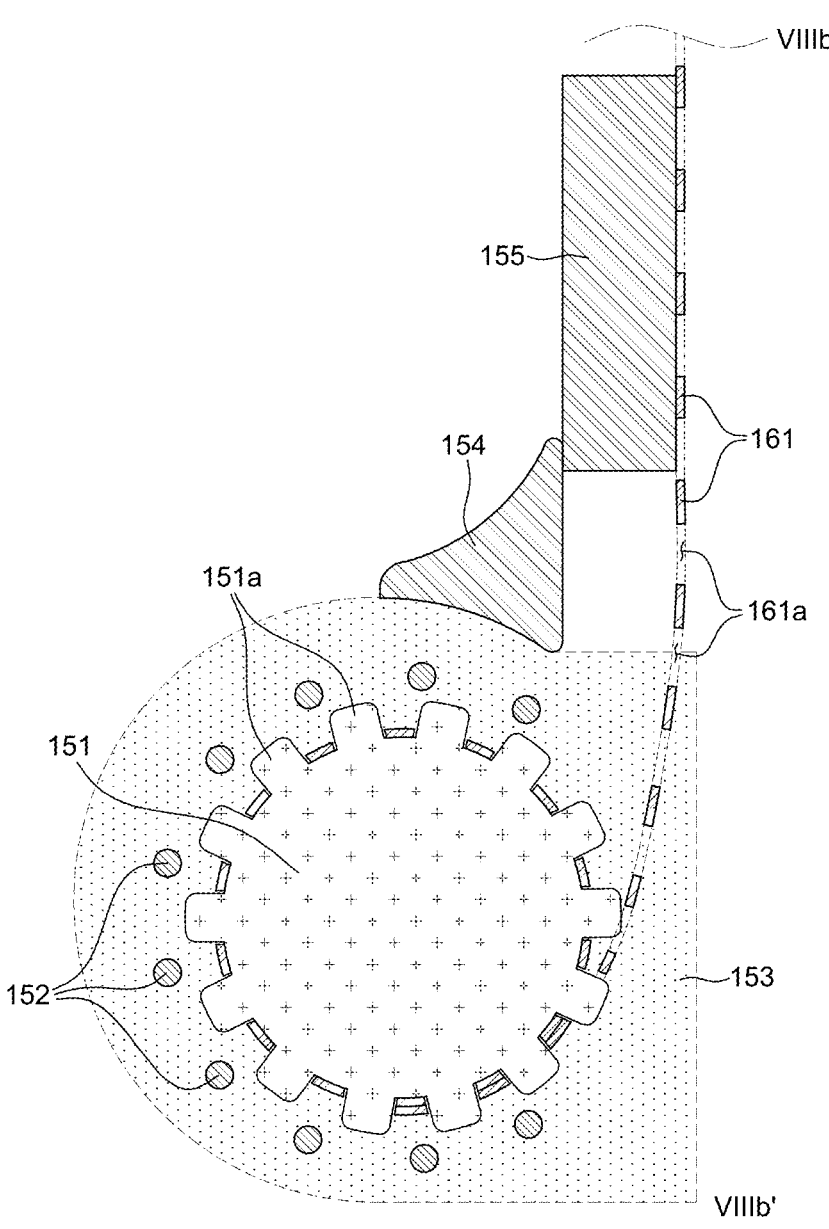
FIG. 8B is a cross-sectional view taken along line VIIIb-VIIIb' in FIG. 7.

FIG. 6 is an exploded perspective view of a second roller of a display device according to another embodiment of the present disclosure. FIG. 7 is a top plan view of the second roller of the display device according to another embodiment of the present disclosure. FIG. 8A is a cross-sectional view taken along line VIIIa-VIIIa' in FIG. 7. FIG. 8B is a cross-sectional view taken along line VIIIb-VIIIb' in FIG. 7. For convenience of description, particularly, FIGS. 8A and 8B illustrate the tape spring side frame 153 indicated by the dotted line. The display device in FIGS. 6 to 8B is substantially identical to the display device 100 in FIGS. 1 to 5, except for second holes 653b, a plurality of sub-rollers 657, and a flat spring 658. Therefore, a repeated description will be omitted or may be briefly provided.

With reference to FIGS. 6 to 8B, the second roller R2 includes the tape spring drum 151, the plurality of rotary pins 152, the tape spring side frames 153, the coupling part 154, the tape spring guide 155, the bearings 156, the plurality of sub-rollers 657, and the flat spring 658.

The tape spring side frames 153 are provided as the pair of tape spring side frames 153 provided at the two opposite sides of the tape spring drum 151. The pair of tape spring side frames 153 can each include the second holes 653b coupled to the ends of the plurality of rotary pins 152. In this case, the second hole 653b can extend along an outer periphery of the tape spring side frame 153.

The second hole 653b can include a first portion 653b1 and a plurality of second portions 653b2 that will be described below. The first portion 653b1 can be a portion extending along the outer periphery of the tape spring side frame 153. In addition, the flat spring 658 can be disposed in the first portion 653b1. The plurality of second portions 653b2 can be portions protruding from the first portion 653b1 toward the first hole 153a. The plurality of second portions 653b2 can be structured to be spaced apart from one another and connected by the first portion 653b1. The plurality of rotary pins 152 can be respectively inserted into the plurality of second portions 653b2. In particular, the plurality of rotary pins 152 can be configured to move in the plurality of second portions 653b2 in a direction toward or away from the tape spring drum 151. The first portion 653b1 and the second portion 653b2 will be described below with reference to FIGS. 9A to 10B.

The plurality of sub-rollers 657 are respectively coupled to the plurality of rotary pins 152. The plurality of sub-rollers 657 can be disposed to adjoin the tape spring 161 wound around the tape spring drum 151. As illustrated in FIG. 7, the plurality of sub-rollers 657 can be symmetrically disposed at two opposite sides based on the plurality of guide protrusions 151a. FIGS. 6 and 7 illustrate that two sub-rollers 657 are disposed on one rotary pin 152. However, the present disclosure is not limited thereto.

The plurality of sub-rollers 657 can rotate clockwise or counterclockwise. The plurality of sub-rollers 657 can rotate in conjunction with the movement of the tape spring 161. Specifically, the plurality of sub-rollers 657, which adjoin the tape spring 161, can be rotated by the movement of the tape spring 161 while the tape spring 161 is wound or unwound. Therefore, even though the plurality of rotary pins 152 and the tape spring 161 adjoin one another, the tape spring 161 can be smoothly wound or unwound by the plurality of rotatable rotary pins 152. Meanwhile, a bearing can be disposed between the rotary pin 152 and the sub-roller 657 to allow the sub-roller 657 to rotate easily. However, the present disclosure is not limited thereto.

The plurality of sub-rollers 657 can be configured to push the tape spring 161, which is wound around the tape spring drum 151, in the direction toward the tape spring drum 151. For example, the plurality of sub-rollers 657 pushes the tape spring 161 while adjoining the tape spring 161, such that the tape spring 161 can be wound in a state in which the tape spring 161 is tightly attached to the tape spring drum 151. Therefore, it is possible to suppress a slip that occurs when the tape spring 161 is wound around the tape spring drum 151.

Meanwhile, a force applied by the plurality of sub-rollers 657 to push the tape spring 161 can be generated by the elasticity of the flat spring 658. The flat spring 658 can be configured to push the plurality of rotary pins 152 in the direction toward the tape spring drum 151. In this case, because the plurality of sub-rollers 657 are coupled to the plurality of rotary pins 152, the plurality of sub-rollers 657 can also be pushed by the flat spring 658 in the direction toward the tape spring drum 151. Therefore, it is possible to suppress the occurrence of a gap or slip in the tape spring 161 when the tape spring 161 is wound or unwound.

The flat spring 658 can be provided as a pair of flat spring 658 respectively corresponding to the pair of tape spring side frames 153. The flat springs 658 are disposed to adjoin the plurality of rotary pins 152. Meanwhile, the flat spring 658 can be fixed to the plurality of rotary pins 152 in areas in which the flat spring 658 and the plurality of rotary pins 152 are in contact with one another. However, the present disclosure is not limited thereto.

The flat spring 658 is disposed in the second hole 653b of the tape spring side frame 153. The flat spring 658 can be disposed in the second hole 653b and adjoin the plurality of rotary pins 152. The flat spring 658 can be disposed in the second hole 653b and have a shape extending along the second hole 653b. In addition, the flat spring 658 can protrude toward the second portions 653b2 or stretch toward the first portion 653b1 depending on a degree to which the tape spring 161 is wound around the tape spring drum 151.

Figure 9A:
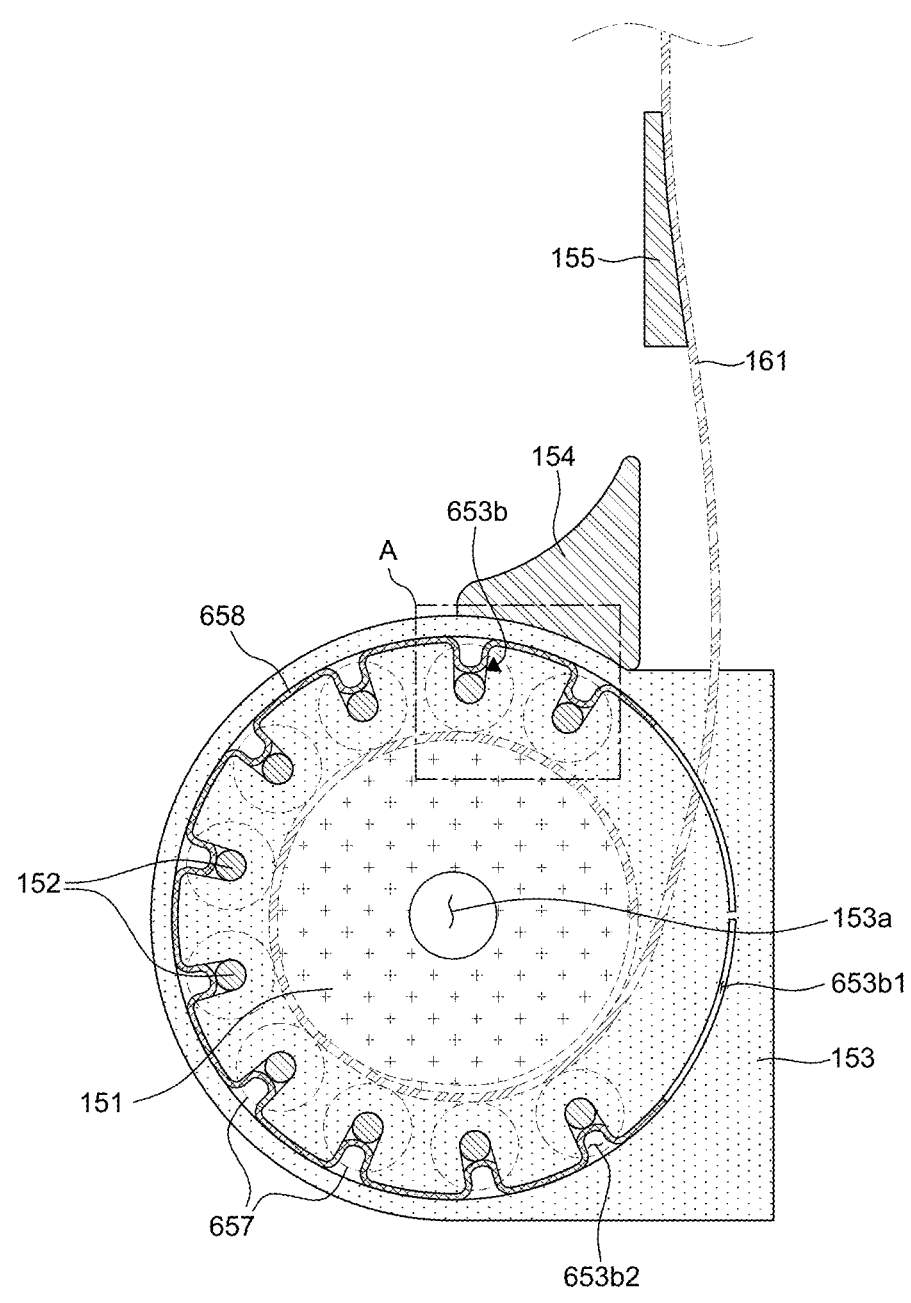
FIGS. 9A to 10B are cross-sectional views for explaining an operation of the second roller of the display device according to another embodiment of the present disclosure.
Figure 9B:
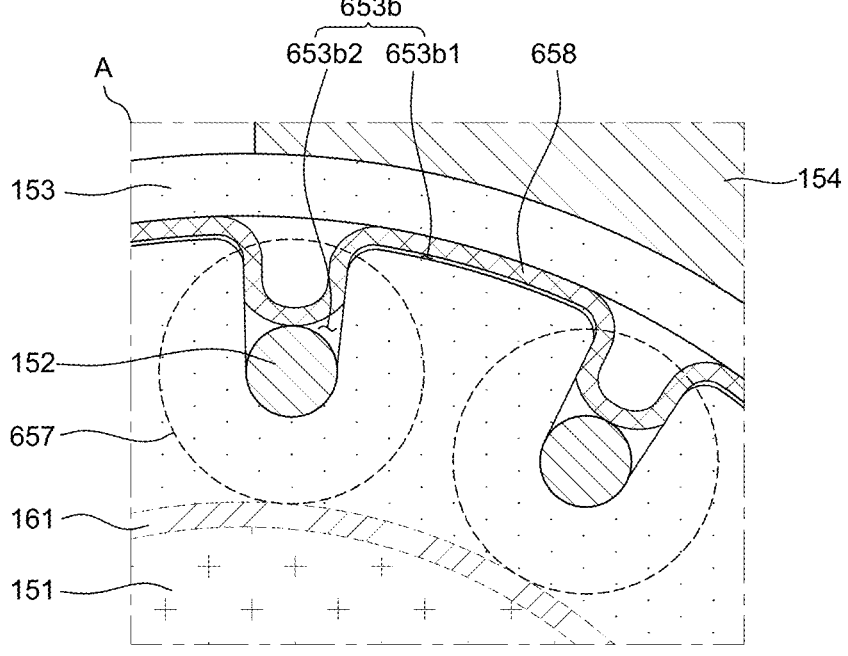
Figure 10A:
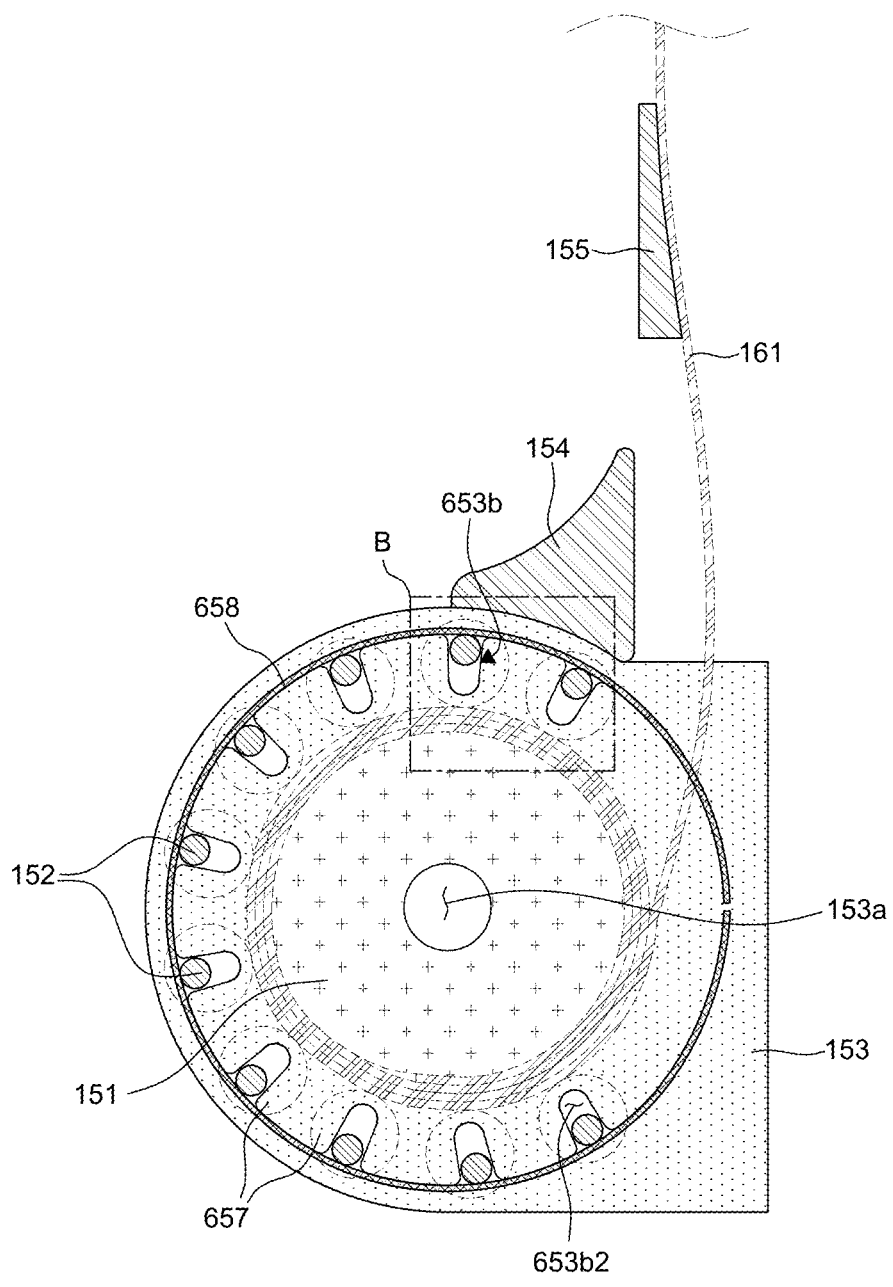
Figure 10B:
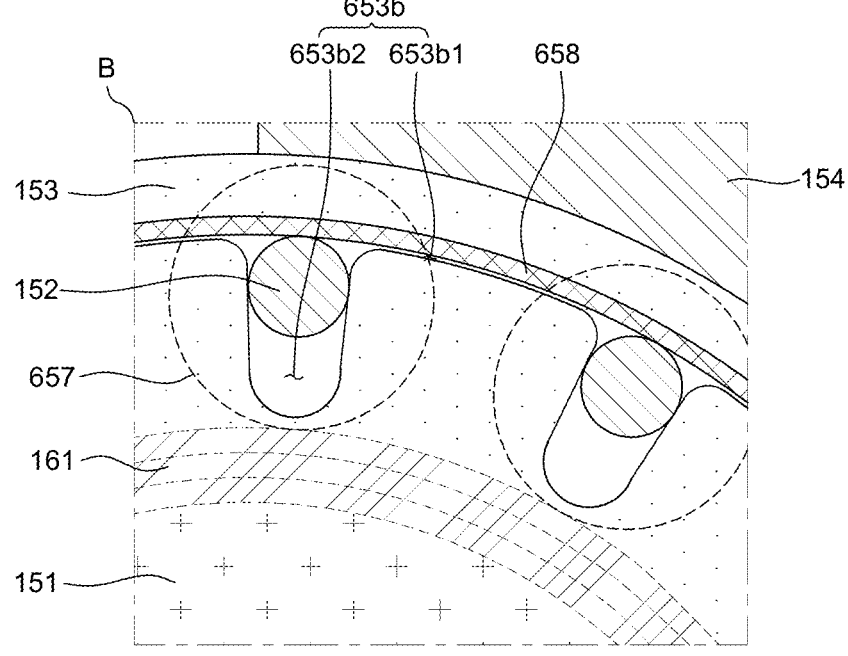

As illustrated in FIGS. 9A and 9B to be described below, the flat spring 658 can have a shape curved to protrude toward the plurality of rotary pins 152 in the areas in which the flat spring 658 adjoins the plurality of rotary pins 152. Therefore, the flat spring 658 can be configured to push the plurality of rotary pins 152 in the direction toward the tape spring drum 151. In addition, the flat spring 658 can be made of a material having elasticity so that a shape of the flat spring 658 can be changed by an external force. Therefore, as illustrated in FIGS. 10A and 10B to be described below, the curved portions of the flat spring 658 can be stretched toward the outside of the tape spring drum 151 when the plurality of rotary pins 152 move in the plurality of second portions 653b2 in the direction away from the tape spring drum 151. In this case, because the flat spring 658 has elasticity, the flat spring 658 has a force that returns the flat spring 658 to the original shape curved toward the plurality of rotary pins 152. Therefore, even though the flat spring 658 is stretched, the flat spring 658 can consistently apply the force to the plurality of rotary pins 152 toward the tape spring drum 151. Therefore, the force, which is applied toward the tape spring drum 151, can be applied to the plurality of rotary pins 152 and the plurality of sub-rollers 657 coupled to the plurality of rotary pins 152 regardless of the shape of the flat spring 658.

Hereinafter, the operations of the plurality of rotary pins 152, the plurality of sub-rollers 657, and the flat spring 658 in accordance with the winding or unwinding motion of the tape spring 161 will be specifically described with reference to FIGS. 9A to 10B.

FIGS. 9A to 10B are cross-sectional views for explaining the operation of the second roller of the display device according to another embodiment of the present disclosure.

Particularly, FIG. 9A illustrates a state in which the tape spring 161 is wound approximately once around the tape spring drum 151 of the display device. FIG. 9B is an enlarged view of area A in FIG. 9A. FIG. 10A illustrates a state in which the tape spring 161 is wound approximately three times around the tape spring drum 151 of the display device. FIG. 10B is an enlarged view of area B in FIG. 10A. Meanwhile, FIGS. 9A to 10B are cross-sectional views illustrating the second holes 653b of the tape spring side frame 153 and the plurality of rotary pins 152 and the flat spring 658 disposed in the second holes 653*b*. However, for convenience of description, FIGS. 9A to 10B also illustrate the tape spring 161, the tape spring drum 151, the sub-rollers 657, and the like.

First, with reference to FIGS. 9A and 9B, the tape spring 161 can be wound around the tape drum 151 approximately once by the rotation of the tape spring drum 151. In this case, the plurality of sub-rollers 657 can be disposed to adjoin the outer peripheral surface of the wound tape spring 161. In particular, the plurality of sub-rollers 657 can push the tape spring 161 in the direction toward the tape spring drum 151 by means of the flat spring 658. Therefore, the tape spring 161 can be wound or unwound in the state in which the tape spring 161 is tightly attached to the tape spring drum 151.

More specifically, as illustrated in FIG. 9B, the plurality of rotary pins 152 coupled to the plurality of sub-rollers 657 can be inserted into the second portions 653*b2* of the plurality of second holes 653*b*. In addition, the flat spring 658, which adjoins the plurality of rotary pins 152, can be disposed to protrude toward the second portions 653*b2* from the first portion 653*b1* of the second hole 653*b* and push the plurality of rotary pins 152 in the direction toward the tape spring drum 151. Specifically, the flat spring 658 can be configured to be curved toward the insides of the plurality of second portions 653*b2* when the plurality of rotary pins 152 are disposed in the plurality of second portions 653*b2*. For example, the flat spring 658 is curved and applies pressure to the plurality of rotary pins 152, such that a force for pushing the plurality of rotary pins 152 toward the insides of the second portions 653*b2* can be applied to the plurality of rotary pins 152. In this case, because the plurality of sub-rollers 657 are coupled to the plurality of rotary pins 152, a force for pushing the plurality of sub-rollers 657 can be applied to the plurality of sub-rollers 657 in the same direction as the force applied to the plurality of rotary pins 152. Therefore, the plurality of sub-rollers 657 can push the tape spring 161 in the direction toward the tape spring drum 151.

Next, with reference to FIGS. 10A and 10B, the tape spring 161 can be wound around the tape spring drum 151 approximately three times by the rotation of the tape spring drum 151. A sum of a diameter of the tape spring drum 151 and a diameter of the tape spring 161 wound around the tape spring drum 151 can increase as the amount by which the tape spring 161 is wound increases. For example, the sum of the diameter of the tape spring drum 151 and the diameter of the wound tape spring 161 can be larger in the state in FIGS. 9A and 9B than in the state in FIGS. 10A and 10B. In this case, the plurality of sub-rollers 657 can be disposed to adjoin the outer peripheral surface of the wound tape spring 161.

In particular, the plurality of sub-rollers 657 can move in the direction away from the tape spring drum 151 as the diameter of the tape spring drum 151 and the diameter of the wound tape spring 161 increase. For example, a distance between the plurality of sub-rollers 657 and the tape spring drum 151 can increase as the amount by which the tape spring 161 is wound around the tape spring drum 151 increases. In other words, the plurality of sub-rollers 657 can be pushed in the direction away from the tape spring drum 151 as the amount by which the tape spring 161 is wound around the tape spring drum 151 increases. However, the plurality of sub-rollers 657 can push the tape spring 161 in the direction toward the tape spring drum 151 by means of the elasticity of the flat spring 658 regardless of the distance between the plurality of sub-rollers 657 and the tape spring drum 151. Therefore, the tape spring 161 can be wound or unwound in the state in which the tape spring 161 is tightly attached to the tape spring drum 151.

More specifically, as illustrated in FIG. 10B, as the plurality of sub-rollers 657 moves in the direction away from the tape spring drum 151, the plurality of rotary pins 152 coupled to the plurality of sub-rollers 657 can also move in the direction away from the tape spring drum 151. For example, a distance between the plurality of rotary pins 152 and the tape spring drum 151 can increase as the amount by which the tape spring 161 is wound around the tape spring drum 151 increases. At the same time, the plurality of rotary pins 152 can move outward from the insides of the plurality of second portions 653*b2*. When the plurality of rotary pins 152 are disposed outside the plurality of second portions 653*b2*, the flat spring 658, which is curved in the plurality of second portions 653*b2*, can be stretched toward the outside of the plurality of second portions 653*b2*. In other words, the curved flat spring 658 can be stretched as the amount by which the tape spring 161 is wound around tape spring drum 151 increases. In addition, as the flat spring 658 is stretched, the flat spring 658 can be disposed to fill two opposite ends of the first portion 653*b1*.

Meanwhile, even though the flat spring 658 is stretched, the flat spring 658 can apply force to the plurality of rotary pins 152 toward the tape spring drum 151. Specifically, because the flat spring 658 is made of a material having elasticity and thus has the property of returning to the original shape. For example, the flat spring 658 can have an elastic force so as to be curved toward the plurality of rotary pins 152. Therefore, the flat spring 658 can apply the force to the plurality of rotary pins 152 toward the insides of the plurality of second portions 653*b2*. In this case, because the plurality of sub-rollers 657 are coupled to the plurality of rotary pins 152, a force for pushing the plurality of sub-rollers 657 can be applied to the plurality of sub-rollers 657 in the same direction as the force applied to the plurality of rotary pins 152. Therefore, the plurality of sub-rollers 657 can push the tape spring 161 in the direction toward the tape spring drum 151.

Meanwhile, FIGS. 10A and 10B illustrate that the plurality of rotary pins 152 are disposed at the outermost peripheries of the plurality of second portions 653*b2* when the tape spring 161 is wound around the tape spring drum 151 three times. However, the present disclosure is not limited thereto. For example, depths of the plurality of second portions 653*b2* can be variously changed in accordance with design of the display device. In addition, the plurality of sub-rollers 657 can be disposed to adjoin the tape spring drum 151 in the state in which the tape spring 161 is fully unwound. However, the present disclosure is not limited thereto.

In the display device according to another embodiment of the present disclosure, the tape spring 161 includes the plurality of guide holes 161*a*, and the tape spring drum 151 includes the plurality of guide protrusions 151*a*. When the tape spring drum 151 rotates, the tape spring 161 can physically move by a predetermined amount. Therefore, it is possible to suppress the occurrence of a gap or slip in the tape spring 161.

In the display device according to another embodiment of the present disclosure, the second roller R2 further includes the plurality of sub-rollers 657 and the flat spring 658. The plurality of sub-rollers 657 can be coupled to the plurality of rotary pins 152. The plurality of sub-rollers 657 can be disposed to adjoin the wound tape spring 161. The flat spring 658 can be disposed to adjoin the plurality of rotary pins 152. In particular, the flat spring 658 can have a shape curved to protrude toward the plurality of rotary pins 152.

Therefore, the flat springs 658 can be configured to push the plurality of rotary pins 152 in the direction toward the tape spring drum 151. In addition, the plurality of sub-rollers 657 coupled to the plurality of rotary pins 152 can also be configured to push the tape spring 161 in the direction toward the tape spring drum 151 by means of the flat spring 658. In this case, the flat spring 658 can be made of an elastic material and curved or stretched depending on the degree to which the tape spring 161 is wound. Therefore, the tape spring 161 can be wound or unwound in the state in which the tape spring 161 is tightly attached to the tape spring drum 151. Therefore, it is possible to more effectively suppress the occurrence of a gap and slip in the tape spring 161.

Figure 11:
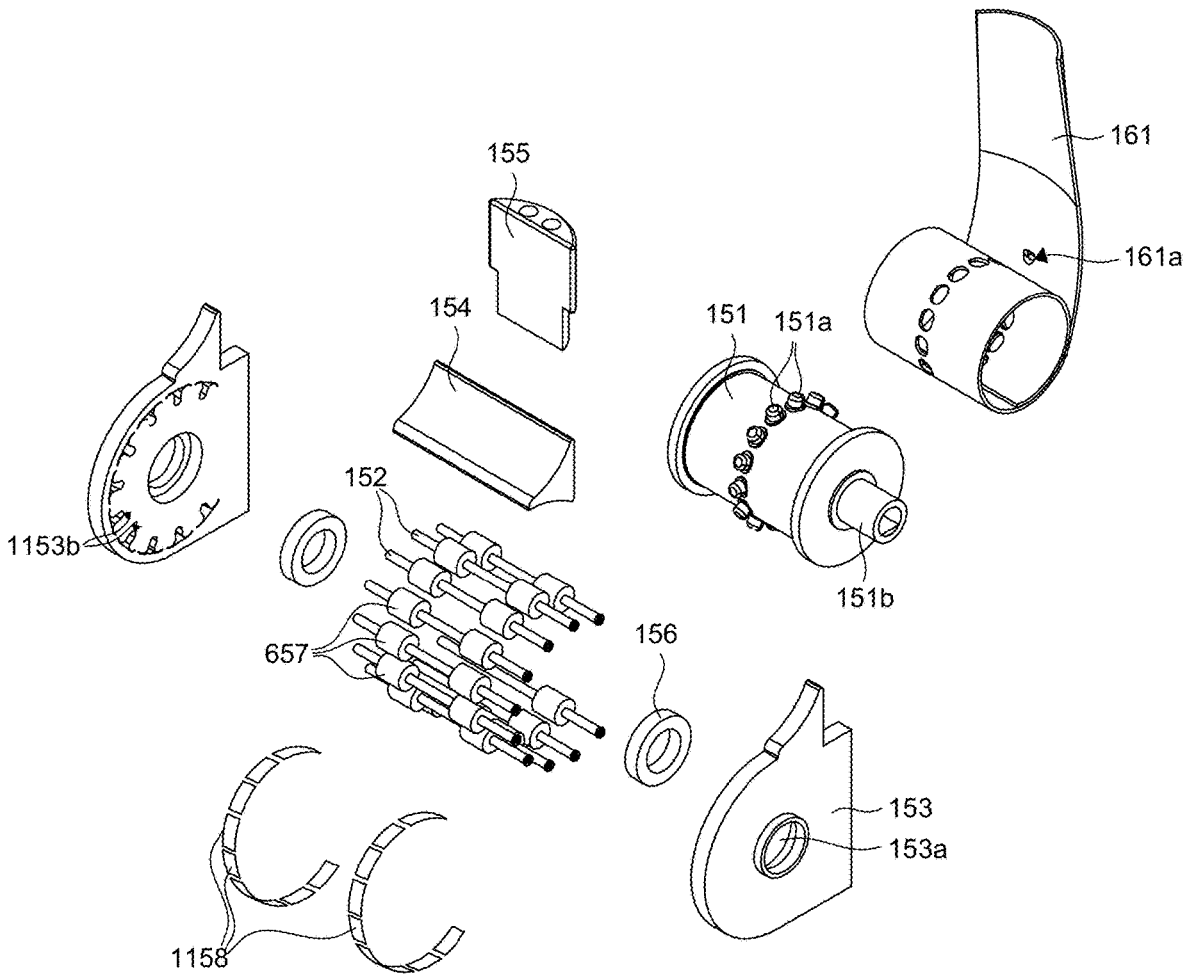
FIG. 11 is an exploded perspective view of a second roller of a display device according to still another embodiment of the present disclosure.
Figure 12A:
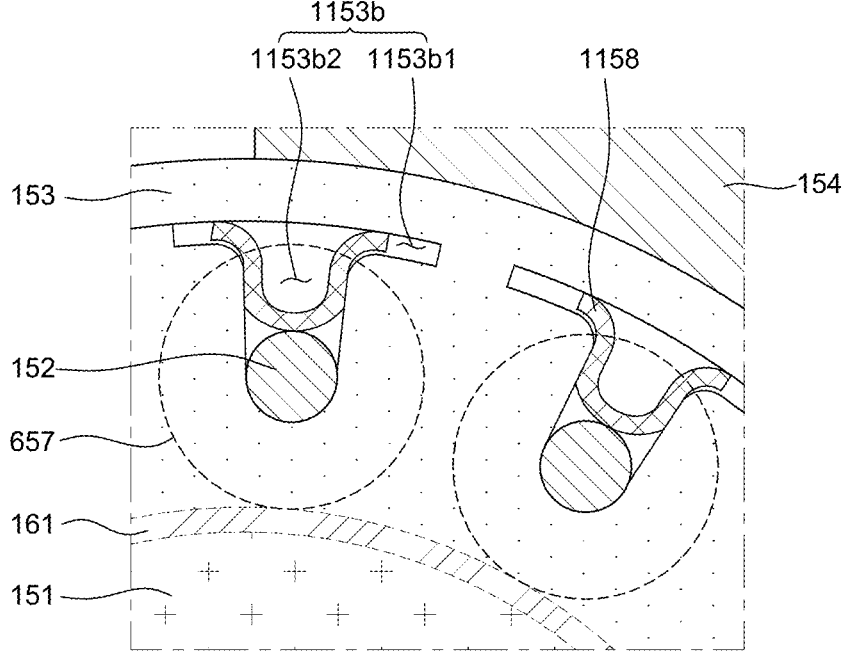
FIGS. 12A and 12B are cross-sectional views for explaining an operation of the second roller of the display device according to still another embodiment of the present disclosure.
Figure 12B:
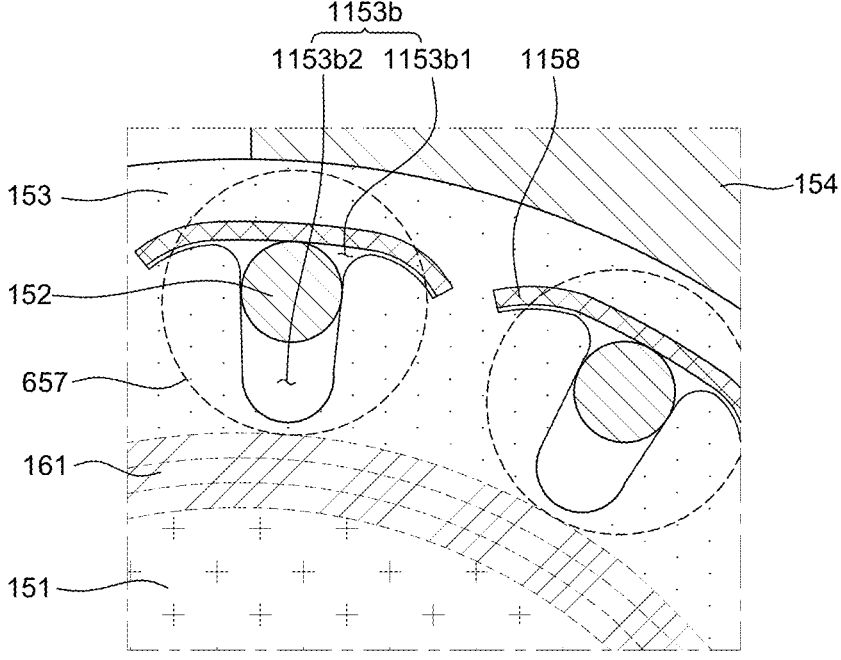

FIG. 11 is an exploded perspective view of a second roller of a display device according to still another embodiment of the present disclosure. FIGS. 12A and 12B are cross-sectional views for explaining an operation of the second roller of the display device according to still another embodiment of the present disclosure. The display device in FIGS. 11 to 12B is substantially identical to the display device in FIGS. 6 to 10B, except for second holes 1153b and flat springs 1158. Therefore, a repeated description will be omitted or may be briefly provided.

First, with reference to FIG. 11, the plurality of second holes 1153b and the plurality of flat springs 1158 can be provided.

The plurality of second holes 1153b can be disposed along the outer periphery of the tape spring side frame 153. The plurality of second holes 1153b can be disposed to be spaced apart from one another at predetermined distances. The plurality of second holes 1153b can include a first portion 1153b1 and a second portion 1153b2. The first portions 1153b1 can be portions disposed along the outer periphery of the tape spring side frame 153. The flat spring 1158 can be disposed in the first portion 1153b1. Therefore, the flat spring 1158 can be curved toward the inside of the second portion 1153b2 from the first portion 1153b1 or stretched toward the outside of the second portion 1153b. The second portion 1153b2 can be a portion protruding toward the first hole 153a from the first portion 1153b1. The rotary pin 152 can be inserted into the second portion 1153b2. Therefore, the plurality of rotary pins 152 can be configured to move in the plurality of second portions 1153b2 in the direction toward or away from the tape spring drum 151.

With reference to FIG. 12A, the tape spring 161 can be wound around the tape spring drum 151 approximately once by the rotation of the tape spring drum 151. In this case, the plurality of sub-rollers 657 can be disposed to adjoin the outer peripheral surface of the wound tape spring 161. In particular, the plurality of sub-rollers 657 can push the tape spring 161 in the direction toward the tape spring drum 151 by means of the flat spring 1158.

Specifically, the plurality of rotary pins 152 can be positioned in the plurality of second portions 1153b2, and the plurality of flat springs 1158 can be disposed to be curved toward the insides of the plurality of second portions 1153b2. The plurality of flat springs 1158 are curved and apply pressure to the plurality of rotary pins 152, such that a force for pushing the plurality of rotary pins 152 toward the insides of the second portions 1153b2 can be applied to the plurality of rotary pins 152. In this case, because the plurality of sub-rollers 657 are coupled to the plurality of rotary pins 152, a force for pushing the plurality of sub-rollers 657 can be applied to the plurality of sub-rollers 657 in the same direction as the force applied to the plurality of rotary pins 152. Therefore, the plurality of sub-rollers 657 can push the tape spring 161 in the direction toward the tape spring drum 151. Therefore, the tape spring 161 can be wound or unwound in the state in which the tape spring 161 is tightly attached to the tape spring drum 151.

With reference to FIG. 12B, the tape spring 161 can be wound around the tape spring drum 151 approximately three times by the rotation of the tape spring drum 151. A sum of a diameter of the tape spring drum 151 and a diameter of the tape spring 161 wound around the tape spring drum 151 can increase as the amount by which the tape spring 161 is wound increases. In this case, the plurality of sub-rollers 657 can be disposed to adjoin the outer peripheral surface of the wound tape spring 161.

In particular, the plurality of sub-rollers 657 can move in the direction away from the tape spring drum 151 as the diameter of the tape spring drum 151 and the diameter of the wound tape spring 161 increase. For example, a distance between the plurality of sub-rollers 657 and the tape spring drum 151 can increase as the amount by which the tape spring 161 is wound around the tape spring drum 151 increases. In other words, the plurality of sub-rollers 657 can be pushed in the direction away from the tape spring drum 151 as the amount by which the tape spring 161 is wound around the tape spring drum 151 increases. However, the plurality of sub-rollers 657 can push the tape spring 161 in the direction toward the tape spring drum 151 by means of the elasticity of the flat springs 1158 regardless of the distance between the plurality of sub-rollers 657 and the tape spring drum 151.

Specifically, as illustrated in FIG. 10B, as the plurality of sub-rollers 657 moves in the direction away from the tape spring drum 151, the plurality of rotary pins 152 coupled to the plurality of sub-rollers 657 can also move in the direction away from the tape spring drum 151. For example, a distance between the plurality of rotary pins 152 and the tape spring drum 151 can increase as the amount by which the tape spring 161 is wound around the tape spring drum 151 increases. At the same time, the plurality of rotary pins 152 can move outward from the insides of the plurality of second portions 1153b2. When the plurality of rotary pins 152 are disposed outside the plurality of second portions 1153b2, the plurality of curved flat springs 1158 can be stretched toward the outside of the plurality of second portions 1153b2. In other words, the plurality of curved flat springs 1158 can be stretched as the amount by which the tape spring 161 is wound around the tape spring drum 151 increases. In addition, as the plurality of flat springs 1158 are stretched, the plurality of flat springs 1158 can be disposed in the first portions 1153b1 to fill two opposite ends of the first portions 1153b1.

Meanwhile, even though the plurality of flat springs 1158 are stretched, the plurality of flat springs 1158 can apply the force to the plurality of rotary pins 152 toward the tape spring drum 151. Specifically, because the plurality of flat springs 1158 are made of a material having elasticity, the plurality of flat springs 1158 can have an elastic force so as to be originally curved toward the plurality of rotary pins 152. Therefore, the plurality of flat springs 1158 can apply the force to the plurality of rotary pins 152 toward the insides of the plurality of second portions 1153b2. In this case, because the plurality of sub-rollers 657 are coupled to the plurality of rotary pins 152, a force for pushing the plurality of sub-rollers 657 can be applied to the plurality of sub-rollers 657 in the same direction as the force applied to the plurality of rotary pins 152. Therefore, the plurality of sub-rollers 657 can push the tape spring 161 in the direction toward the tape spring drum 151. Therefore, the tape spring 161 can be wound or unwound in the state in which the tape spring 161 is tightly attached to the tape spring drum 151.

In the display device according to still another embodiment of the present disclosure, the tape spring 161 includes the plurality of guide holes 161a, and the tape spring drum 151 includes the plurality of guide protrusions 151a. When the tape spring drum 151 rotates, the tape spring 161 can physically move by a predetermined amount. Therefore, it is possible to suppress the occurrence of a gap or slip in the tape spring 161.

In the display device according to still another embodiment of the present disclosure, the second roller R2 includes the plurality of rotary pins 152, the plurality of sub-rollers 657 coupled to the plurality of rotary pins 152, and the plurality of flat springs 1158 configured to press the plurality of rotary pins 152. Therefore, the plurality of flat springs 1158 can be configured to push the plurality of rotary pins 152 in the direction toward the tape spring drum 151. In addition, the plurality of sub-rollers 657 coupled to the plurality of rotary pins 152 can also be configured to push the tape spring 161 in the direction toward the tape spring drum 151 by means of the plurality of flat springs 1158. Therefore, the tape spring 161 can be wound or unwound in the state in which the tape spring 161 is tightly attached to the tape spring drum 151. Therefore, it is possible to more effectively suppress the occurrence of a gap and slip in the tape spring 161.

The plurality of flat springs 1158 can be disposed to respectively correspond to the plurality of rotary pins 152. In addition, all the plurality of flat springs 1158 and the plurality of rotary pins 152 can be disposed in the plurality of second holes 1153b spaced apart from one another. Therefore, the plurality of flat springs 1158 and the plurality of rotary pins 152 can be easily coupled to the tape spring side frames 153. Therefore, the plurality of flat springs 1158 and the plurality of rotary pins 152 can more smoothly operate, and the occurrence of a gap or slip in the tape spring 161 can be more effectively suppressed.

Figure 13:
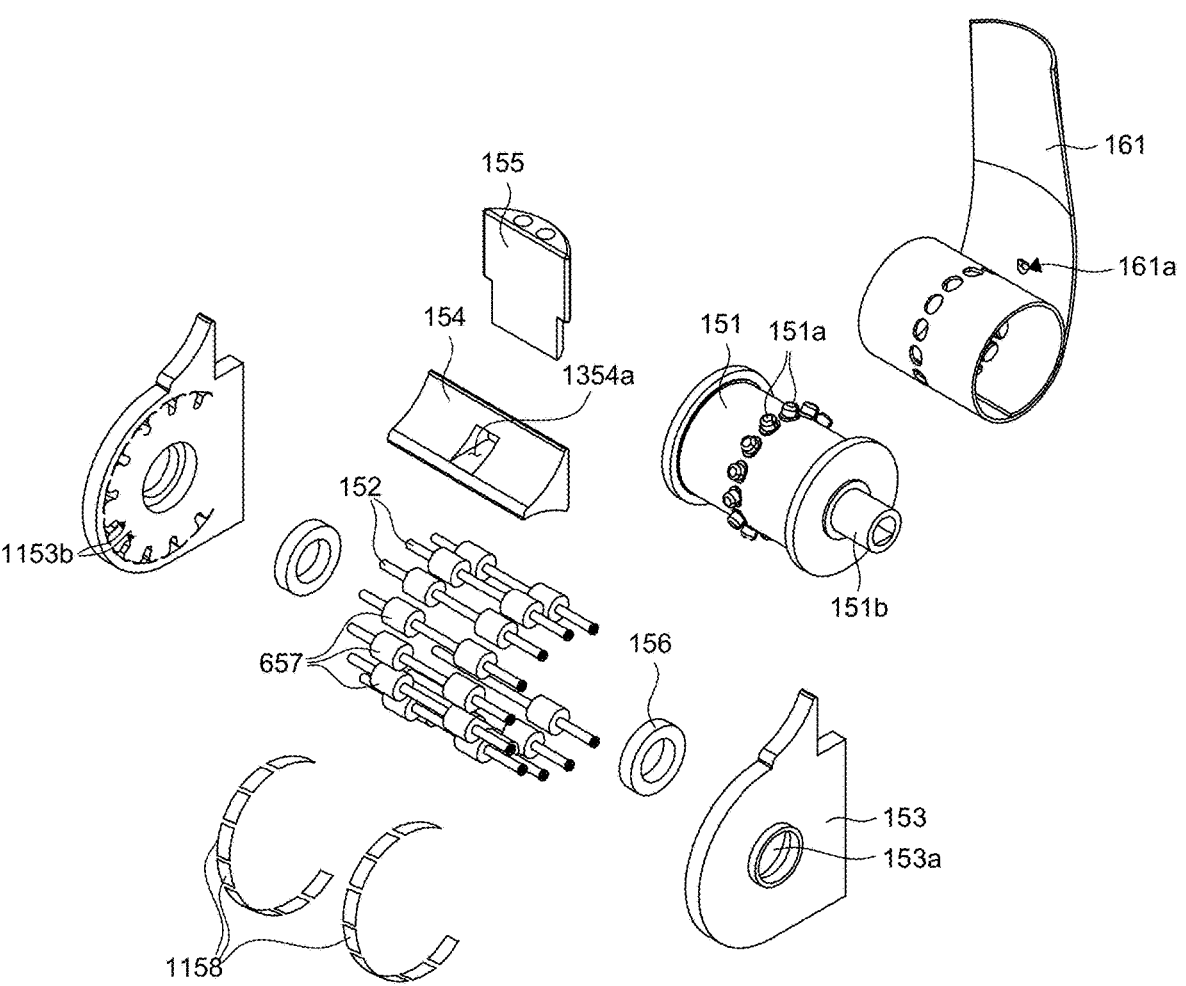
FIG. 13 is an exploded perspective view of a second roller of a display device according to yet another embodiment of the present disclosure.
Figure 14:
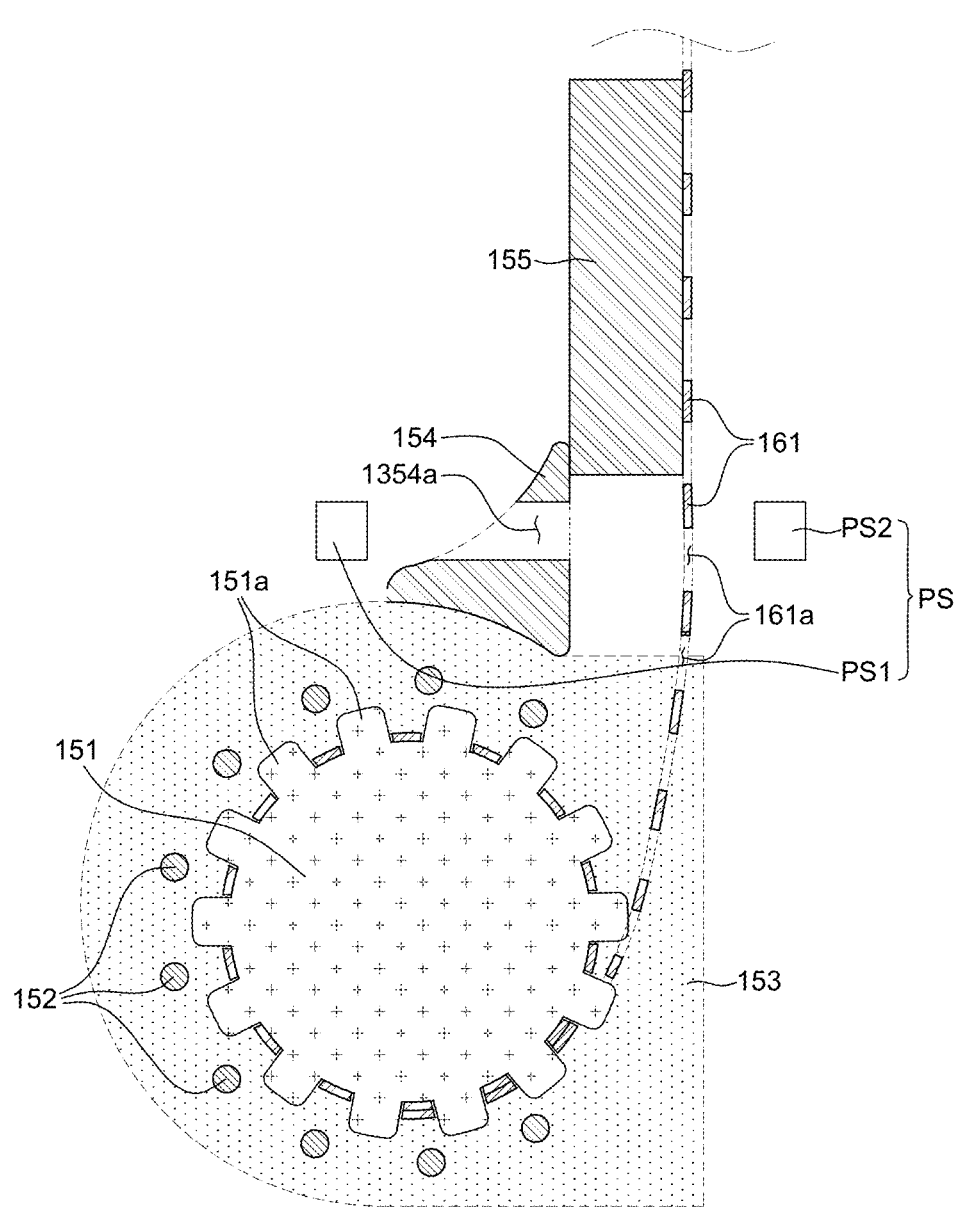
FIG. 14 is a cross-sectional view of the second roller of the display device according to yet another embodiment of the present disclosure.

FIG. 13 is an exploded perspective view of a second roller of a display device according to yet another embodiment of the present disclosure. FIG. 14 is a cross-sectional view of the second roller of the display device according to yet another embodiment of the present disclosure. The display device in FIGS. 13 and 14 is substantially identical to the display device in FIGS. 11 to 12B, except for a sensor hole 1354a and a photo sensor PS. Therefore, a repeated description will be omitted or may be briefly provided.

With reference to FIGS. 13 and 14, the coupling part 154 includes the sensor hole 1354a formed through the coupling part 154. In this case, the sensor hole 1354a can be disposed at one side of a route along which the tape spring 161 moves. In addition, the photo sensor PS can be configured at two opposite sides based on the sensor hole 1354a. Specifically, the photo sensor PS can include a light-transmitting part PS1 disposed at one side based on the sensor hole 1354a, and a light-receiving part PS2 disposed at the other side based on the sensor hole 1354a. Light emitted from the light-transmitting part PS1 can pass through the sensor hole 1354a and be transmitted to the light-receiving part PS2. The light-transmitting part PS1 and the light-receiving part PS2 can be fixed by at least any one of constituent elements of the roller part RP or the frame part FP. However, the present disclosure is not limited thereto.

In case that the sensor hole 1354a and one of the plurality of guide holes 161a of the tape spring 161 are positioned on a straight line, the light emitted from the light-transmitting part PS1 can pass through the sensor hole 1354a and the guide hole 161a and be transmitted to the light-receiving part PS2. In case that the sensor hole 1354a and one of the plurality of guide holes 161a of the tape spring 161 are not positioned on a straight line, the light emitted from the light-transmitting part PS1 is blocked by the tape spring 161 without being transmitted to the light-receiving part PS2.

Meanwhile, the display device can further include a roller controller. The roller controller can be connected to the photo sensor PS and the motor MT. The roller controller can determine the degree to which the tape spring 161 is wound or unwound based on a sensing result of the photo sensor PS. For example, the roller controller can transmit a signal to the light-transmitting part PS1 to allow the light-transmitting part PS1 to emit light. In addition, in case that the emitted light is transmitted to the light-receiving part PS2, the light-receiving part PS2 can transmit a sensing signal to the roller controller. In addition, the roller controller can control the rotation of the motor MT based on the degree to which the tape spring 161 is wound or unwound. For example, the rotations of the first and second rollers R1 and R2 can be controlled by the roller controller. The roller controller can be disposed on the printed circuit board 140. However, the present disclosure is not limited thereto.

The number of signals sensed by the light-receiving part PS2 can correspond to the number of guide holes 161a formed through the photo sensor PS. Therefore, the degree to which the tape spring 161 is wound or unwound can be determined based on the number of guide holes 161a formed through the photo sensor PS. In addition, the roller controller can store a length of the tape spring 161, intervals between the plurality of guide holes 161a, a length of the display part DP, and the like. Therefore, the roller controller can determine a length of the wound or unwound tape spring 161 and a length of the wound or unwound display part DP based on a sensing result of the light-receiving part PS2. Therefore, in case that a user intends to wind or unwind the display part DP by a particular amount, the roller controller can control a rotational speed of the motor based on the sensing result of the photo sensor PS. Therefore, the amount by which the display device is wound and unwound can be more precisely controlled.

In general, the amount by which the display device is wound and unwound can be controlled by controlling the rotational speed of the motor. However, even though the rotational speed of the motor is controlled, the movement amount of the tape spring may not be accurately controlled because of the elasticity of the tape spring, the friction between the tape spring and the other constituent elements, and the occurrence of a gap or slip in the tape spring. This can eventually cause a movement defect of the display part, which can degrade the quality of the display device.

In the display device according to yet another embodiment of the present disclosure, the movement amount of the tape spring 161 can be precisely controlled by the photo sensor PS and the roller controller. Specifically, the coupling part 154 of the second roller R2 includes the sensor hole 1354a configured to transmit the light emitted from the photo sensor PS and receive the light. The light-transmitting part PS1 and the light-receiving part PS2 of the photo sensor PS can be respectively disposed at one side and the other side based on the sensor hole 1354a. Therefore, in case that the sensor hole 1354a and the guide hole 161a of the tape spring 161 are disposed on a straight line, the light emitted from the light-transmitting part PS1 can be received by the light-receiving part PS2. The roller controller can measure the number of moved guide holes 161a based on the sensing result of the light-receiving part PS2 and determine the length of the wound or unwound tape spring 161. Therefore, it is possible to more accurately measure the movement amount of the tape spring 161 and more precisely control the movement amount of the display part.

In the display device according to yet another embodiment of the present disclosure, the tape spring 161 includes the plurality of guide holes 161*a*, and the tape spring drum 151 includes the plurality of guide protrusions 151*a*. When the tape spring drum 151 rotates, the tape spring 161 can physically move by a predetermined amount. Therefore, it is possible to suppress the occurrence of a gap or slip in the tape spring 161.

In the display device according to still another embodiment of the present disclosure, the second roller R2 includes the plurality of rotary pins 152, the plurality of sub-rollers 657 coupled to the plurality of rotary pins 152, and the plurality of flat springs 1158 configured to press the plurality of rotary pins 152. Therefore, the plurality of flat springs 1158 can be configured to push the plurality of rotary pins 152 in the direction toward the tape spring drum 151. In addition, the plurality of sub-rollers 657 coupled to the plurality of rotary pins 152 can also be configured to push the tape spring 161 in the direction toward the tape spring drum 151 by means of the plurality of flat springs 1158. Therefore, the tape spring 161 can be wound or unwound in the state in which the tape spring 161 is tightly attached to the tape spring drum 151. Therefore, it is possible to more effectively suppress the occurrence of a gap and slip in the tape spring 161.

The example embodiments of the present disclosure can also be described as follows:

According to an aspect of the present disclosure, there is provided a display device. The display device includes a display part comprising a display panel configured to display an image, a first roller configured to wind or unwind the display part; a tape spring disposed on a rear surface of the display part, configured to move the display part in an upward/downward direction, and including a plurality of guide holes, and a second roller configured to wind or unwind the tape spring, wherein the second roller comprises a tape spring drum to which one end of the tape spring is fixed, the tape spring drum being configured to wind or unwind the tape spring and including a plurality of guide protrusions, and a plurality of rotary pins spaced apart from the tape spring drum and disposed along an outer peripheral surface of the tape spring drum.

The plurality of guide protrusions of the tape spring drum can be inserted into the plurality of guide holes of the tape spring when the tape spring is wound around the tape spring drum.

The plurality of guide holes can be disposed in a longitudinal direction of the tape spring.

A rotation axis of the tape spring drum and a rotation axis of the plurality of rotary pins can be parallel to each other.

The second roller can further comprise a pair of tape spring side frames disposed to face each other and including first holes coupled to two opposite ends of the tape spring drum, and a plurality of second holes coupled to two opposite ends of the plurality of rotary pins, a flat spring disposed in the plurality of second holes of the pair of tape spring side frames and configured to adjoin the plurality of rotary pins, and a plurality of sub-rollers respectively coupled to the plurality of rotary pins.

The flat spring can be configured to push the plurality of rotary pins in a direction toward the tape spring drum.

The flat spring is configured to allow the plurality of sub-rollers to push the tape spring in the direction toward the tape spring drum.

A distance between the plurality of sub-rollers and the tape spring drum increases as the amount by which the tape spring can be wound around the tape spring drum increases.

A distance between the plurality of rotary pins and the tape spring drum increases as the amount by which the tape spring can be wound around the tape spring drum increases.

The plurality of rotary pins can be configured to move in the plurality of second holes in a direction toward or away from the tape spring drum.

The flat spring can be configured to be curved toward the insides of the plurality of second holes when the plurality of rotary pins is positioned in the plurality of second holes, and wherein the flat spring is configured to be stretched toward the outside of the plurality of second holes when the plurality of rotary pins is disposed outside the plurality of second holes.

The plurality of second holes disposed in each of the pair of tape spring side frames can be connected.

The plurality of second holes disposed in each of the pair of tape spring side frames can be spaced apart from one another, and the flat spring includes a plurality of sub-flat springs spaced apart from one another so as to respectively correspond to the plurality of rotary pins.

The display device can further comprise a photo sensor including a light-transmitting part and a light-receiving part, wherein the second roller further includes a coupling part disposed above the tape spring drum and coupled to the pair of tape spring side frames, and wherein the coupling part includes a sensor hole through which light emitted from the light-transmitting part passes.

The light-transmitting part can be disposed at one side based on the sensor hole, and the light-receiving part is disposed at the other side based on the sensor hole.

The display device can further comprise a roller controller configured to control rotations of the first and second rollers, wherein the roller controller controls the rotations of the first and second rollers based on a sensing result of the light-receiving part of the photo sensor.

The display device can further comprise a motor connected to the second roller, wherein the roller controller controls the rotations of the first and second rollers by controlling a rotation of the motor based on the sensing result.

The present disclosure being thus described, it will be obvious that the same may be varied in many ways. Such variations are not to be regarded as a departure from the spirit and scope of the present disclosure, and all such modifications as would be obvious to one skilled in the art are intended to be included within the scope of the following claims.

What is claimed is:

1. A display device comprising:
a display part comprising a display panel configured to display an image;
a first roller configured to wind or unwind the display part;
a tape spring disposed on a rear surface of the display part, configured to move the display part in an upward/downward direction, and including a plurality of guide holes; and
a second roller configured to wind or unwind the tape spring,
wherein the second roller comprises:
a tape spring drum to which one end of the tape spring is fixed, the tape spring drum being configured to wind or unwind the tape spring and including a plurality of guide protrusions; and a plurality of rotary pins spaced apart from the tape spring drum and disposed along an outer peripheral surface of the tape spring drum.

2. The display device of claim 1, wherein the plurality of guide protrusions of the tape spring drum is inserted into the plurality of guide holes of the tape spring when the tape spring is wound around the tape spring drum.

3. The display device of claim 1, wherein the plurality of guide holes is disposed in a longitudinal direction of the tape spring.

4. The display device of claim 1, wherein a rotation axis of the tape spring drum and a rotation axis of the plurality of rotary pins are parallel to each other.

5. The display device of claim 1, wherein the second roller further comprises:

a pair of tape spring side frames disposed to face each other, the pair of tape spring side frames including a plurality of first holes coupled to two opposite ends of the tape spring drum, and a plurality of second holes coupled to two opposite ends of the plurality of rotary pins;

a flat spring disposed in the plurality of second holes of the pair of tape spring side frames and configured to adjoin the plurality of rotary pins; and a plurality of sub-rollers respectively coupled to the plurality of rotary pins.

6. The display device of claim 5, wherein the flat spring is configured to push the plurality of rotary pins in a direction toward the tape spring drum.

7. The display device of claim 6, wherein the flat spring is configured to allow the plurality of sub-rollers to push the tape spring in the direction toward the tape spring drum.

8. The display device of claim 5, wherein a distance between the plurality of sub-rollers and the tape spring drum increases as an amount by which the tape spring is wound around the tape spring drum increases.

9. The display device of claim 5, wherein a distance between the plurality of rotary pins and the tape spring drum increases as an amount by which the tape spring is wound around the tape spring drum increases.

10. The display device of claim 9, wherein the plurality of rotary pins is configured to move in the plurality of second holes in a direction toward or away from the tape spring drum.

11. The display device of claim 10, wherein the flat spring is configured to be curved toward insides of the plurality of second holes when the plurality of rotary pins is positioned in the plurality of second holes, and wherein the flat spring is configured to be stretched toward an outside of the plurality of second holes when the plurality of rotary pins is disposed outside of the plurality of second holes.

12. The display device of claim 5, wherein the plurality of second holes disposed in each of the pair of tape spring side frames is connected.

13. The display device of claim 5, wherein the plurality of second holes disposed in each of the pair of tape spring side frames is spaced apart from one another, and the flat spring includes a plurality of sub-flat springs spaced apart from one another so as to respectively correspond to the plurality of rotary pins.

14. The display device of claim 5, further comprising:

a photo sensor including a light-transmitting part and a light-receiving part, wherein the second roller further includes a coupling part disposed on the tape spring drum and coupled to the pair of tape spring side frames, and wherein the coupling part includes a sensor hole through which light emitted from the light-transmitting part passes.

15. The display device of claim 14, wherein the light-transmitting part is disposed at one side based on the sensor hole, and the light-receiving part is disposed at another side based on the sensor hole.

16. The display device of claim 14, further comprising:

a roller controller configured to control rotations of the first and second rollers, wherein the roller controller controls the rotations of the first and second rollers based on a sensing result of the light-receiving part of the photo sensor.

17. The display device of claim 16, further comprising:

a motor connected to the second roller, wherein the roller controller controls the rotations of the first and second rollers by controlling a rotation of the motor based on the sensing result of the light-receiving part of the photo sensor.

* * * * *